(12) United States Patent
Jin et al.

(10) Patent No.: US 10,134,476 B2
(45) Date of Patent: *Nov. 20, 2018

(54) MEMORY SYSTEM USING NON-LINEAR FILTERING SCHEME AND READ METHOD THEREOF

(71) Applicant: SAMSUNG ELECTRONICS CO., LTD., Suwon-si, Gyeonggi-Do (KR)

(72) Inventors: Dongsup Jin, Seoul (KR); Pilsang Yoon, Hwaseong-si (KR); Hong Rak Son, Anyang-si (KR); Junjin Kong, Yongin-si (KR); Young-Seop Shim, Seoul (KR); Jinman Han, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/857,898

(22) Filed: Dec. 29, 2017

(65) Prior Publication Data

US 2018/0122484 A1   May 3, 2018

Related U.S. Application Data

(63) Continuation of application No. 15/398,602, filed on Jan. 4, 2017, now Pat. No. 9,892,796.

(30) Foreign Application Priority Data

Jan. 12, 2016  (KR) .................. 10-2016-0003636

(51) Int. Cl.
*G11C 7/00* (2006.01)
*G11C 16/26* (2006.01)
(Continued)

(52) U.S. Cl.
CPC .............. *G11C 16/26* (2013.01); *G06F 3/061* (2013.01); *G06F 3/0653* (2013.01); *G06F 3/0659* (2013.01); *G06F 3/0679* (2013.01); *G11C 7/02* (2013.01); *G11C 16/0466* (2013.01); *G11C 16/0483* (2013.01); *G11C 16/28* (2013.01);
(Continued)

(58) Field of Classification Search
CPC ....... G11C 16/26; G11C 7/02; G11C 16/0466; G11C 16/0483; G11C 16/28; G11C 29/021; G11C 29/028
See application file for complete search history.

(56) References Cited

U.S. PATENT DOCUMENTS 7,177,195 B2   2/2007   Gonzalez et al.
7,679,133 B2   3/2010   Son et al.
(Continued)

*Primary Examiner* — Pho M Luu
(74) *Attorney, Agent, or Firm* — F. Chau & Associates, LLC

(57) ABSTRACT

A method for controlling a nonvolatile memory device includes requesting a plurality of first sampling values from the nonvolatile memory device, each of the first sampling values representing the number of memory cells having a threshold voltage between a first sampling read voltage and a second sampling read voltage. The first sampling values are processed through a non-linear filtering operation to estimate the number of memory cells having the threshold voltage between the first sampling read voltage and the second sampling read voltage.

35 Claims, 20 Drawing Sheets

(51) Int. Cl.
    *G06F 3/06*         (2006.01)
    *G11C 16/04*      (2006.01)
    *G11C 7/02*        (2006.01)
    *G11C 16/28*      (2006.01)
    *G11C 29/02*      (2006.01)
    *G11C 29/50*      (2006.01)
    *G11C 11/56*      (2006.01)
    *G11C 29/04*      (2006.01)

(52) U.S. Cl.
    CPC .......... *G11C 29/021* (2013.01); *G11C 29/028* (2013.01); *G11C 29/50004* (2013.01); *H05K 999/99* (2013.01); *G11C 11/5642* (2013.01); *G11C 2029/0409* (2013.01)

(56) References Cited

U.S. PATENT DOCUMENTS

| | | | |
|---|---|---|---|
| 7,936,601 B2 | 5/2011 | Kang et al. | |
| 8,154,921 B2 | 4/2012 | Mokhlesi et al. | |
| 8,422,307 B2 | 4/2013 | Yoo et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,804,431 B2 | 8/2014 | Miwa et al. | |
| 8,839,073 B2 | 9/2014 | Cohen | |
| 8,953,373 B1 | 2/2015 | Wu et al. | |
| 9,076,545 B2 | 7/2015 | Mokhlesi | |
| 9,111,626 B2 | 8/2015 | Kim et al. | |
| 9,190,163 B2 | 11/2015 | Park et al. | |
| 9,514,830 B2* | 12/2016 | Han | G11C 16/28 |
| 9,613,687 B2 | 4/2017 | Kim et al. | |
| 9,653,156 B2* | 5/2017 | Shirakawa | G11C 11/5642 |
| 9,773,563 B2* | 9/2017 | Atsumi | G11C 16/26 |
| 9,892,796 B2* | 2/2018 | Jin | G11C 16/26 |
| 2009/0003057 A1 | 1/2009 | Kang et al. | |
| 2010/0091535 A1 | 4/2010 | Sommer et al. | |
| 2011/0233648 A1 | 9/2011 | Seol et al. | |
| 2013/0094290 A1 | 4/2013 | Sridharan et al. | |
| 2015/0154064 A1 | 6/2015 | Ghaly et al. | |
| 2017/0200505 A1 | 7/2017 | Jin et al. | |

* cited by examiner

FIG. 7

| Cell Count | CC0 | CC1 | CC2 | CC3 | CC4 |
|---|---|---|---|---|---|
| SR1 | 1750 | 1595 | 1490 | 1402 | 1502 |
| SR2 | 1680 | 1610 | 1500 | 1413 | 1498 |
| SR3 | 1480 | 1590 | 1505 | 1395 | 1489 |
| SR4 | 1760 | 1600 | 1300 | 1425 | 1505 |
| SR5 | 1755 | 1615 | 1495 | 1409 | 1520 |
| Median | 1750 | 1600 | 1495 | 1409 | 1502 | min_value

MEMORY SYSTEM USING NON-LINEAR FILTERING SCHEME AND READ METHOD THEREOF

CROSS-REFERENCE TO RELATED APPLICATIONS

This application is a continuation of U.S. Pat. No. 9,892,796 filed Jan. 4, 2017, which claims priority under 35 U.S.C. § 119 to Korean Patent Application No. 10-2016-0003636 filed on Jan. 12, 2016, in the Korean Intellectual Property Office, the entire contents of which are hereby incorporated by reference.

BACKGROUND

The disclosure relates to a semiconductor memory device, and in particular, to a memory system capable of determining a read level of a nonvolatile memory device in a non-linear filtering scheme and a read method thereof.

Semiconductor memory devices are roughly divided into a volatile semiconductor memory device or a nonvolatile semiconductor memory device. The volatile semiconductor memory device is characterized in that a read/write speed is fast and data stored therein disappears at power-off. In contrast, the nonvolatile semiconductor memory device retains data stored therein even at power-off. Therefore, the nonvolatile semiconductor memory device may store contents to be preserved regardless of whether a power supply is supplied or not.

A representative example of the nonvolatile memory device is a flash memory device. A flash memory device is being used as voice and image data storage media of information devices such as a computer, a cellular phone, a smart phone, a personal digital assistant (PDA), a digital camera, a camcorder, a voice recorder, an MP3 player, a handheld PC, a game console, a facsimile device, a scanner, and a printer. Techniques for high-capacity, high-speed, and low-power nonvolatile memory devices are being developed to mount the nonvolatile memory device in a mobile device such as a smart phone.

As a high-capacity nonvolatile memory device is required, a multi-level cell (MLC) or multi-bit memory device storing a plurality of bits per cell becomes more common. In a memory system including multi-level cells, however, threshold voltages of memory cells are included in four or more states which are distinguishable within a restricted voltage window. Such states may shift due to various causes. In this case, a read voltage may be adjusted to be optimized for a shifted position.

A reliable sampling read operation for adjusting a read voltage is required according to an increase in an integration level, scale-down, and the use of a three-dimensional cell array.

SUMMARY

Embodiments of the disclosure may minimize the effects of noise occurring during a sampling read operation.

One aspect of embodiments of the disclosure is directed to provide a method for controlling a nonvolatile memory device. The method may include requesting a plurality of first sampling values from the nonvolatile memory device, each of the first sampling values representing the number of memory cells having a measured threshold voltage between a first sampling read voltage and a second sampling read voltage. The first sampling values may be processed through a non-linear filtering operation to estimate the number of memory cells having the threshold voltage between the first sampling read voltage and the second sampling read voltage.

Another aspect of embodiments of the disclosure is directed to provide a method for determining a read voltage in a nonvolatile memory device comprising three-dimensionally stacked memory cells. The method may include requesting the nonvolatile memory device to acquire a plurality of sampling values for each of a plurality of voltage bands. For each of the voltage bands, a non-linear filtering operation may be performed with respect to the corresponding sampling values to estimate the number of memory cells having threshold voltages within the voltage band. The read voltage of the nonvolatile memory device may be determined using the estimated number of memory cells for each of the voltage bands.

Still another aspect of embodiments of the disclosure is directed to provide a memory system. The memory system may include a nonvolatile memory device configured to output, in response to a sampling read command, a sampling value representing the number of memory cells having a measured threshold voltage between a first sampling read voltage and a second sampling read voltage, among selected memory cells. A controller may be configured to iteratively transfer the sampling read command to the nonvolatile memory device. The controller may process a plurality of sampling values, which the nonvolatile memory device outputs in response to the iteratively transferred sampling read commands, to estimate the number of memory cells having the threshold voltage between the first sampling read voltage and the second sampling read voltage.

Still another aspect of embodiments of the disclosure is directed to provide a method, executed by a memory controller, for determining a read voltage of a nonvolatile memory device. The method includes requesting the nonvolatile memory device to acquire a plurality of sampling values for each of a plurality of voltage bands, each sampling value indicating the number of memory cells, within the nonvolatile memory device, having a measured threshold value within the voltage band. The sampling values are received from the nonvolatile memory device for each of the voltage bands and, for each of the voltage bands, the number of memory cells having threshold voltages within the voltage band is estimated by applying a non-linear filtering operation to the received sampling values corresponding to the voltage band. The read voltage of the nonvolatile memory device is acquired from the estimated number of memory cells within each of the voltage hands.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 7 is a diagram illustrating a non-linear filtering manner according to an embodiment of the disclosure;

DETAILED DESCRIPTION

Figure 1:
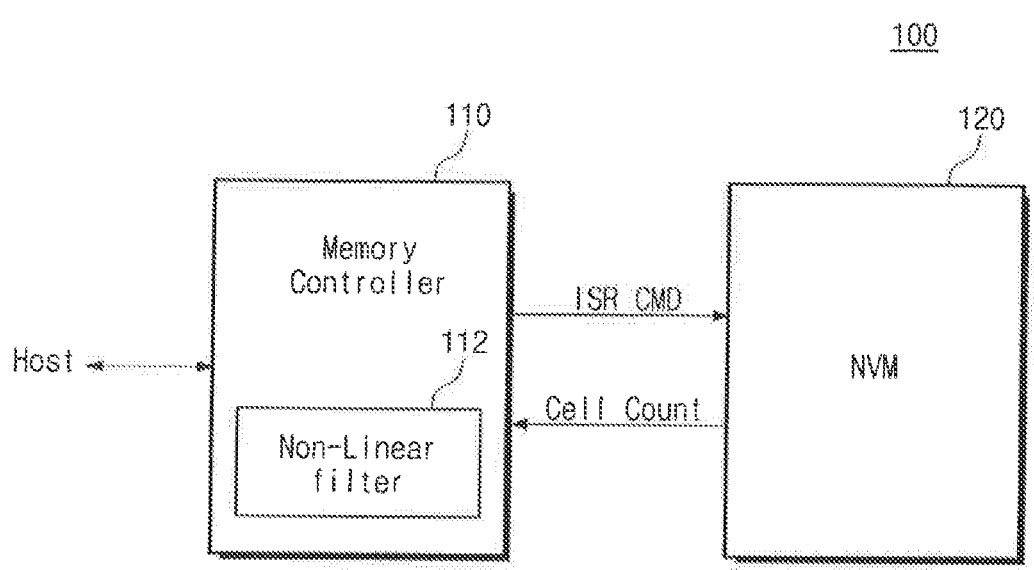
FIG. 1 is a block diagram illustrating a memory system according to an embodiment of the disclosure.

It may be understood that both the foregoing general description and the following detailed description are provided as examples, for illustration and not for limiting the scope of the disclosure. Reference will now be made in detail to the present preferred embodiments of the disclosure, examples of which are illustrated in the accompanying drawings. Wherever possible, the same reference numbers are used in the drawings and the description to refer to the same or like parts.

Below, to describe features and functions of the disclosure, a NAND flash memory device will be exemplified as a nonvolatile memory device. However, other features and operations may be easily understood from information disclosed herein. For example, the disclosure may be applied to a phase-change random access memory (PRAM), a mangentoresistive RAM (MRAM), a resistive RAM (RAM or ReRAM), a ferroelectric RAM (FRAM), a NOR flash memory, and the like.

The disclosure may be implemented or applied through other embodiments. In addition, the detailed description may be changed or modified according to view points and applications without departing from the claims, the scope and spirit, and any other purposes of the disclosure.

FIG. 1 is a block diagram illustrating a memory system according to an embodiment of the disclosure. Referring to FIG. 1, a memory system 100 may include a memory controller 110 and a nonvolatile memory device 120. To determine an accurate read voltage for a situation such as read failure, the memory controller 110 may provide an iterative sampling read command (ISR CMD) to the nonvolatile memory device 120. The nonvolatile memory device 120 may output a cell count (Cell Count) in response to the iterative sampling read command ISR CMD. The memory controller 110 may determine an optimal read voltage with reference to the cell count. This will be described in more detail below.

The memory controller 110 may be configured to control the nonvolatile memory device 120 in response to a request of a host. The memory controller 110 may provide a write command or write data to the nonvolatile memory device 120 in response to a write request from the host. When receiving a read request from the host, the memory controller 110 may control the nonvolatile memory device 120 so as to sense and output data of a corresponding address.

In particular, the memory controller 110 may provide the iterative sampling read command ISR CMD to the nonvolatile memory device 120. The iterative sampling read command ISR CMD may be a command for requesting the nonvolatile memory device 120 to output a plurality of sampling values corresponding to a cell count for a specific voltage range. In response to the iterative sampling read command ISR CMD, the nonvolatile memory device 120 may output a plurality of sampling values corresponding to the number of memory cells having a threshold voltage between a first read voltage level RD1 and a second read voltage level RD2.

In another embodiment, the iterative sampling read command ISR CMD may be a command for requesting a sampling value of a read count between the first read voltage level RD1 and the second read voltage level RD2 from the nonvolatile memory device 120 several times.

The memory controller 110 may receive a plurality of sampling values of a cell count for the same voltage range and may process the received sampling values in a non-linear filtering scheme. For example, the most accurate cell count may be generated by processing the plurality of sampling values of the cell count for the specific voltage range in the non-linear sampling scheme. The memory controller 110 may include a non-linear filter 112 for the non-linear sampling scheme.

The memory controller 110 may provide the iterative sampling read command ISR CMD with respect to each of a plurality of voltage ranges. The memory controller 110 may process sampling values of a cell count outputted with respect to each of the voltage ranges in the non-linear filtering scheme. The memory controller 110 may determine a read voltage corresponding to a valley with reference to a sampling value generated as the non-linear filtering result. For example, the memory controller 110 may determine the read voltage by applying a linear regression analysis or selecting a minimum value with reference to a sampling value generated as the non-linear filtering result.

The nonvolatile memory device 120 may include one or more memory devices. The nonvolatile memory device 120 may sense selected memory cells with different sampling read voltages in response to the iterative sampling read command ISR CMD. The nonvolatile memory device 120 may determine a cell count, which corresponds to the number of memory cells having a threshold voltage between different sampling read voltages $R_i$ and $R_{i+1}$, with reference to the sensing result. For example, the nonvolatile memory device 120 may perform an exclusive OR operation (XOR) for sampling values obtained using the different sampling read voltages $R_i$ and $R_{i+1}$. The nonvolatile memory device 120 may output a cell count, which corresponds to a result of the exclusive OR operation, to the memory controller 110. In the exclusive OR operation, the number of ones (1s) may be a sampling value of a cell count corresponding to the number of memory cells having a threshold voltage between the read voltages Ri and Ri+1. In response to the iterative sampling read command ISR CMD, the nonvolatile memory device 120 may repeat the above-described read operation by a specific frequency with respect to a section between the read voltages Ri and Ri+1.

The memory controller 110 may determine a sampling value for a corresponding voltage range with reference to a result of a read operation iteratively performed in the same voltage range. That is, the memory controller 110 may minimize an influence due to noise by processing results of a plurality of read operations in a non-linear filtering operation.

According to an embodiment of the disclosure, it may be possible to determine an optimal read voltage for memory cells of the nonvolatile memory device 120. The memory controller 110 of the disclosure may process a sampling read result sensitive to the noise in the non-linear sampling scheme, thereby making it possible to exclude a sampling value distorted due to the noise. This may mean that a read voltage with high reliability is generated even in a noisy environment.

Figure 2:
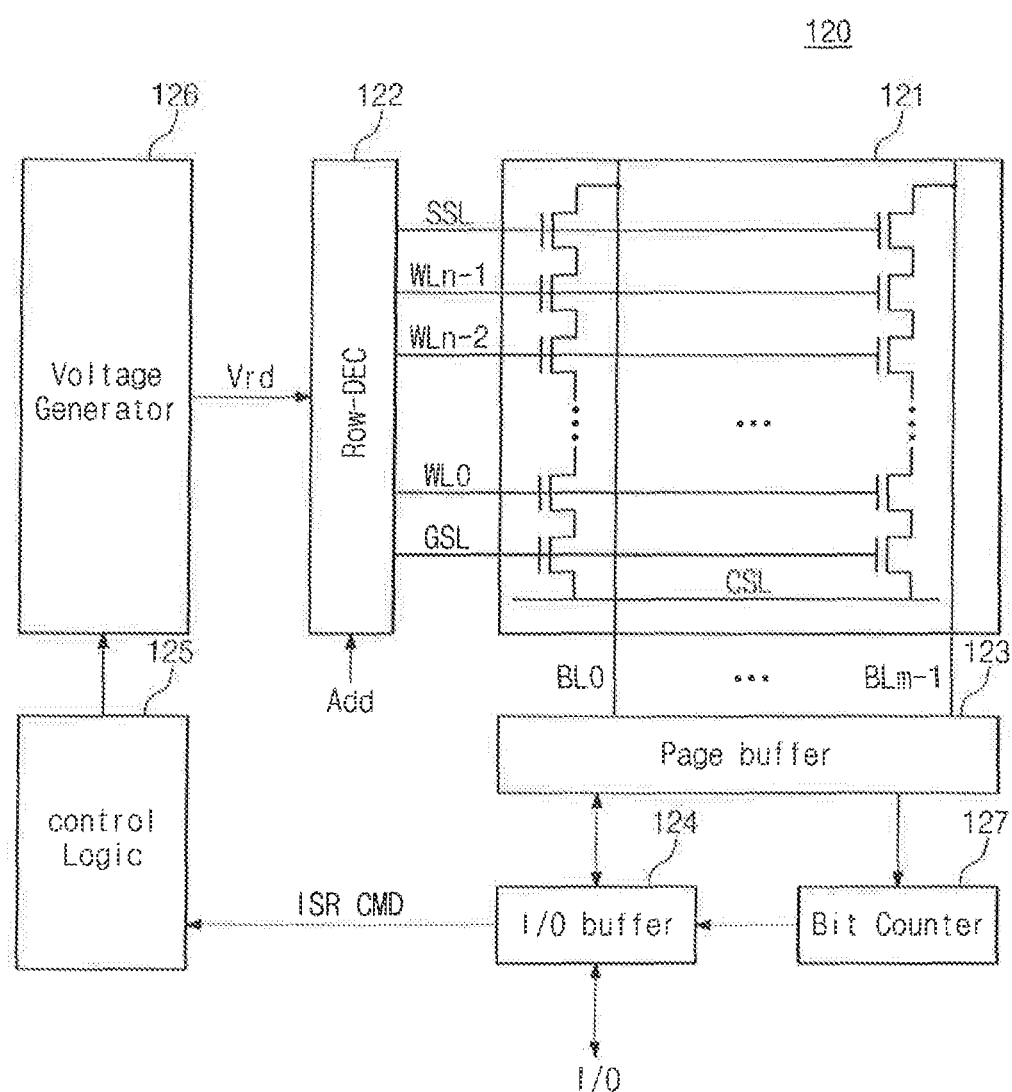
FIG. 2 is a block diagram illustrating a nonvolatile memory device of FIG. 1.

FIG. 2 is a block diagram illustrating a nonvolatile memory device of FIG. 1. Referring to FIG. 2, the nonvolatile memory device 120 may include a cell array 121, a row decoder 122, a page buffer 123, an input/output buffer 124, control logic 125, a voltage generator 126, and a bit counter 127.

The cell array 121 may be connected to the mw decoder 122 through word lines WL0-WLn-1 and selection lines GSL, SSL. The cell array 121 may be connected to the page buffer 123 through bit lines BL0 to BLm-1. The cell array 121 may include a plurality of cell strings formed in a NAND type array. The cell strings may constitute a memory block BLK. Here, a channel of each cell string may be formed in a vertical or horizontal direction.

In an embodiment, the cell array 121 may be implemented with a three dimensional (3D) memory array. The 3D memory array is monolithically formed in one or more physical levels of arrays of memory cells having an active area disposed above a silicon substrate and with circuitry associated with the operation of those memory cells, whether such associated circuitry is above or within such substrate. The term "monolithic" means that layers of each level of the array are directly deposited on the layers of each underlying level of the array.

In an embodiment of the disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure as the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

During a program operation, memory cells may be selected by a unit (e.g., 2 KB) equal in size to a page or by a unit (e.g., 512B) smaller in size than the page. During a read operation, memory cells may be selected by the unit (e.g., 2 KB) equal in size to the page or by the unit (e.g., 512B) smaller in size than the page. Due to various causes, a threshold voltage distribution of memory cells at a read point in time may be different from that at a program point in time. Accordingly, to improve data integrity, a level of a read voltage may be adjusted in the light of a threshold voltage change.

The row decoder 122 may select one of the memory blocks BLK1 to BLKi of the cell array 121 in response to an address ADD. The row decoder 122 may select one of the word lines in the selected memory block. The row decoder 122 may transfer a read voltage Vrd from the voltage generator 126 to the selected word line. During a program operation, the row decoder 122 may transfer a program voltage and a verification voltage to a selected word line and a pass voltage to an unselected word line, respectively. During a read operation, the row decoder 122 may transfer a selection read voltage and a non-selection read voltage to a selected word line and a pass voltage to an unselected word line, respectively.

The page buffer 123 may operate as a write driver during a program operation and as a sense amplifier during a read operation. During a program operation, the page buffer 123 may transfer a bit line voltage corresponding to to-be-programmed data to a hit line of the cell array 121. During a read operation, the page buffer 123 may sense data stored in a selected memory cell through a bit line. The page buffer 123 may latch the sensed data and may output the latched data to the input/output buffer 124.

The input/output buffer 124 may transfer write data received during a program operation to the page buffer 123. The input/output buffer 124 may output data from the page buffer 123 to the outside during a read operation. The input/output buffer 124 may transfer a received address Add or command to the row decoder 122 or the control logic 125.

The control logic 125 may control the row decoder 122 and the page buffer 123 in response to a command received from the outside. The control logic 125 may control the page buffer 123 and the voltage generator 126 in response to the iterative sampling read command ISR CMD received from the memory controller 110, so as to sense selected memory cells. For example, the control logic 125 may control the page buffer 123 and the voltage generator 126 so as to iteratively sense selected memory cells with sampling read voltages Ri and Ri+1 selected through the iterative sampling read command ISR CMD. Pieces of data read through a plurality of sampling read operations may be stored in the page buffer 123 and may be counted through the bit counter 127. Cell counts calculated by the bit counter 127 may be transferred to the memory controller 110 through the input/output buffer 124.

The voltage generator 126 may generate various word line voltages to be supplied to word lines and a voltage which is supplied to a bulk (e.g., a well area) where memory cells are formed, under control of the control logic 125. The word line voltages to be supplied to the word lines may include a program voltage (e.g., Vpgm_i), a pass voltage (e.g., Vpass), a selection read voltage (e.g., Vrd), a non-selection read voltage (e.g., Vread), and the like. The voltage generator 126 may further generate selection line voltages (e.g., VSSL and VGSL) to be provided to the selection lines SSL and GSL during a read operation or a program operation. Furthermore, under control of the control logic 125, the voltage generator 126 may generate a specific read voltage Ri and may provide the specific read voltage Ri.

The bit counter 127 may count the number of cells with reference to a sensing result for each of the sampling read voltages Ri and Ri+1 selected through the iterative sampling read command ISR CMD. A sensing result for each of the sampling read voltages Ri and Ri+1 may be latched in the page buffer 123 and may be provided to the bit counter 127. The bit counter 127 may compare read result data for the sampling read voltages Ri and Ri+1 to count the number of memory cells having a threshold voltage between the sampling read voltages Ri and Ri+1. For example, the bit counter 127 may count the number of memory cells by performing an exclusive OR operation on the read result data obtained using the sampling read voltages Ri and Ri+1.

To this end, the bit counter 127 may include latches (or registers) for storing at least two pages of data and a logic gate array for the exclusive OR operation. For example, the bit counter 127 may have latches for storing two pages of data read using different read voltages. The bit counter 127 may include a logic gate string which performs the exclusive OR operation for bits belonging to the same column. In addition, the bit counter 127 may include a counter circuit (now shown) which counts the number of 1s included in data of a page size outputted from the logic gate string. An output of the counter circuit may correspond to a cell count corresponding to corresponding sampling read voltages Ri and Ri+1.

With the above description, when the iterative sampling read command ISR CMD is received from the memory controller 110, the nonvolatile memory device 120 may iteratively perform a sensing operation using the sampling read voltages Ri and Ri+1 and may calculate the number of memory cells sensed during each sensing operation. The nonvolatile memory device 120 may provide each calculation result to the memory controller 110.

Figure 3:
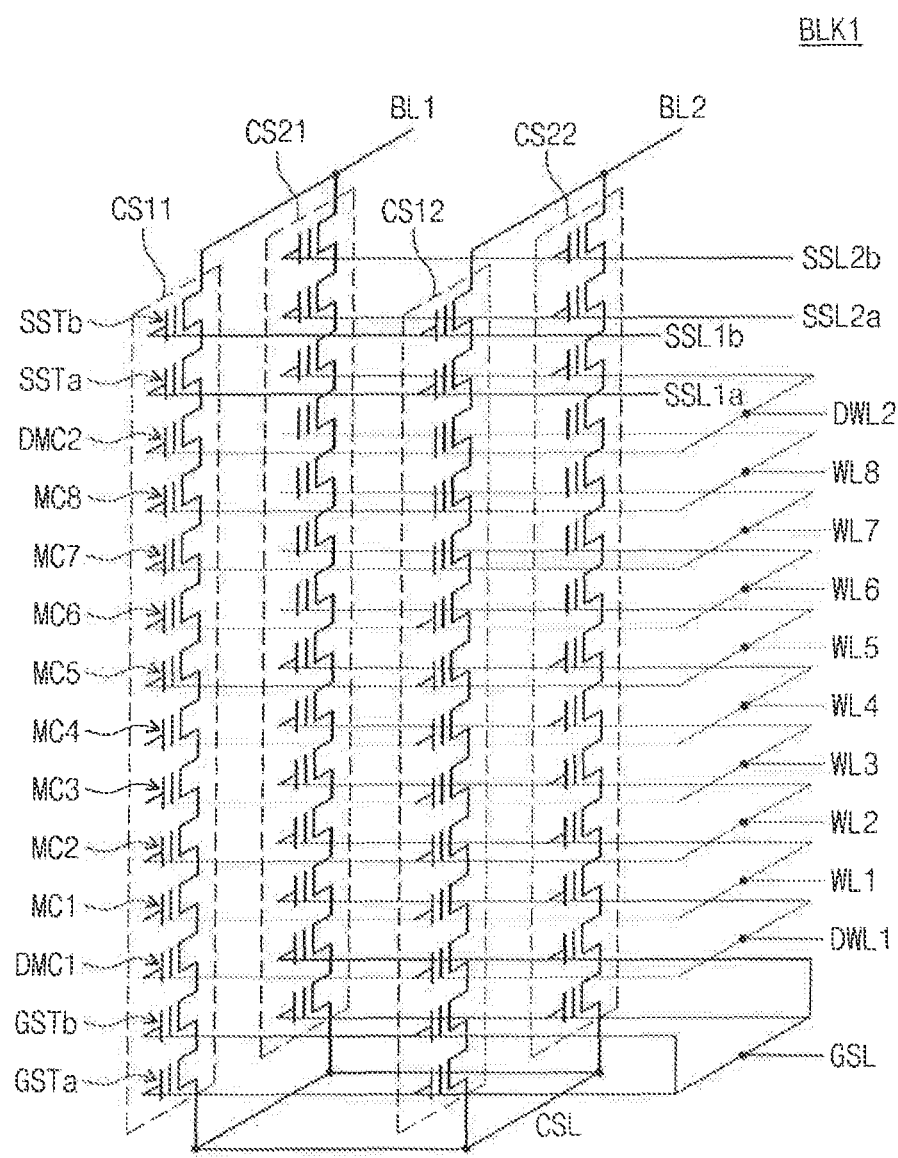
FIG. 3 is a circuit diagram illustrating one of multiple memory blocks included in a memory cell array in FIG. 2.

FIG. 3 is a circuit diagram illustrating one of multiple memory blocks included in a memory cell array in FIG. 2. In an embodiment, a memory block BLK1 having a three-dimensional structure will be described with reference to FIG. 3. Referring to FIG. 3, the memory block BLK1 may include a plurality of cell strings CS11, CS12, CS21, and CS22. The cell strings CS11, CS12, CS21, and CS22 may be arranged along a row direction and a column direction and may form rows and columns.

For example, the cell strings CS11 and CS12 may be connected to string selection lines SSL1a and SSL1b to constitute a first row. The cell strings CS21 and CS22 may be connected to string selection lines SSL2a and SSL2b to constitute a second row. For example, the cell strings CS11 and CS21 may be connected to a first bit line BL1 to constitute a first column. The cell strings CS12 and CS22 may be connected to a second bit line BL2 to constitute a second column.

Each of the cell strings CS11, CS12, CS21, and CS22 may include a plurality of cell transistors. Each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. In an embodiment, each of the memory cells included in the cell strings CS11, CS12, CS21, and CS22 may be a charge trap flash (CTF) memory cell.

The memory cells MC1 to MC8 may be serially connected and may be stacked in a height direction being a direction perpendicular to a plane defined by the row direction and the column direction. The string selection transistors SSTa and SSTb may be serially connected and may be disposed between the memory cells MC1 to MC8 and a bit line BL. The ground selection transistors GSTa and GSTb may be serially connected and may be disposed between the memory cells MC1 to MC8 and a common source line CSL.

In an embodiment, a first dummy memory cell DMC1 may be disposed between the memory cells MC1 to MC8 and the ground selection transistors GSTa and GSTb. In an embodiment, a second dummy memory cell DMC2 may be disposed between the memory cells MC1 to MC8 and the string selection transistors SSTa and SSThb.

The ground selection transistors GSTa and GSTb of the cell strings CS11, CS12, CS21, and CS22 may be connected in common to a ground selection line GSL. In an embodiment, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to the first ground selection line, and the first ground selection transistors GSTa of the cell strings CS21 and CS22 in the second row may be connected to the second ground selection line.

Memory cells placed at the same height from the substrate (or the ground selection transistors GSTa and GSTb) may be connected in common to the same word line, and memory cells placed at different heights therefrom may be connected to different word lines. For example, the first to eighth memory cells MC1 to MC8 in cell strings CS11, CS12, CS21, and CS22 may be commonly connected the first to eighth word lines WL1 to WL8, respectively.

String selection transistors, belonging to the same row, from among the first string selection transistors SSTa at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL2a.

String selection transistors, belonging to the same row, from among the second string selection transistors SSTb at the same height may be connected to the same string selection line, and string selection transistors belonging to different rows may be connected to different string selection lines. For example, the second string selection transistors SSTb of the cell strings CS11 and CS12 in the first row may be connected in common to the string selection line SSL1b, and the second string selection transistors SSTb of the cell strings CS21 and CS22 in the second row may be connected in common to the string selection line SSL2b.

In an embodiment, dummy memory cells at the same height may be connected with the same dummy word line, and dummy memory cells at different heights may be connected with different dummy word lines. For example, the first dummy memory cells DMC1 may be connected with the first dummy word line DWL1, and the second dummy memory cells DMC2 may be connected with the second dummy word line DWL2.

The memory block BLK1 illustrated in FIG. 3 may be an example. For example, the number of cell strings may increase or decrease, and the number of rows of cell strings and the number of columns of cell strings may increase or decrease according to the number of cell strings. In the memory block BLK1, the number of cell transistors (GST, MC, DMC, SST, or the like) may increase or decrease, and a height of the memory block BLK1 may increase or decrease according to the number of cell transistors (GST, MC, DMC, SST, or the like). Furthermore, the number of lines (GSL, WL, DWL, SSL, or the like) connected with cell transistors may increase or decrease according to the number of cell transistors (GST, MC, DMC, SST, or the like).

As memory cells are formed to have the above-described shape and are managed in a multi-level cell (MLC) scheme, the memory cells may be affected by a lot of noise even during an operation to estimate a valley, in a situation such as read failure, and to adjust a read voltage based on the estimated valley. That is, a sampling read voltage for any one voltage range may increase or decrease due to the noise. In this case, a distorted value of a cell count may make it difficult to determine an accurate read voltage. However, an influence due to the noise may be appropriately blocked through the sampling read operation of the disclosure.

Figure 4:
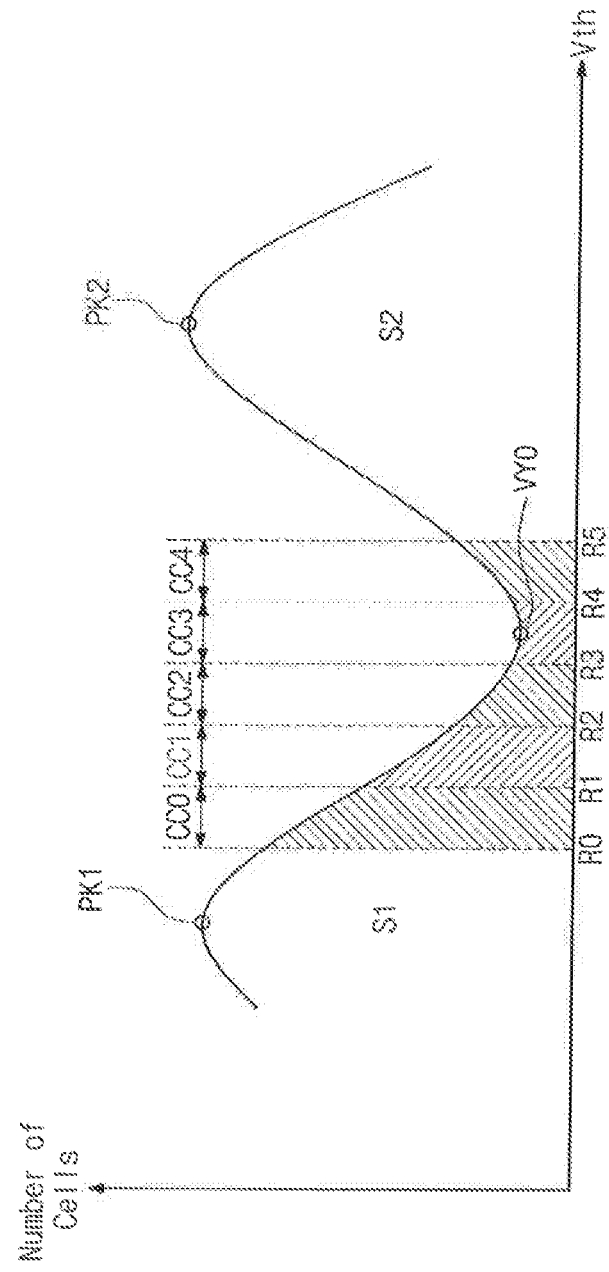
FIG. 4 is a diagram for describing a sampling read method according to an embodiment of the disclosure.

FIG. 4 is a diagram for describing a sampling read operation for determining a valley, according to an embodiment of the disclosure. Referring to FIG. 4, an iterative sampling read operation may be performed with the memory system 100 of the disclosure to determine an optimal read voltage for discriminating two states S1 and S2 of memory cells. Here, the iterative sampling read operation may refer to an operation to iteratively perform sensing and cell counting with respect to read voltage ranges Ri and Ri+1 to obtain cell counts CC0, CC1, CC2, CC3, and CC4.

First of all, an iterative sampling read operation may be performed to obtain the cell count CC0. The memory controller 110 may transfer the iterative sampling read command ISR CMD to the nonvolatile memory device 120. In this case, the iterative sampling read command ISR CMD provided to the nonvolatile memory device 120 may include an address of to-be-selected memory cells, sampling read voltages (e.g., R0 and R1) to be applied to the to-be-selected memory cells, and a sampling read frequency. The nonvolatile memory device 120 may sense selected memory cells with the sampling read voltage R0 and the sampling read voltage R1 in response to the iterative sampling read command ISR CMD. The nonvolatile memory device 120 may calculate the cell count CC0 using pieces of data respectively sensed using the sampling read voltages R0 and R1. The calculated cell count CC0 may be transferred to the memory controller 110. The nonvolatile memory device 120 may repeat the sampling read operation with the sampling read voltages R0 and R1 as many as a predefined sampling read frequency. The nonvolatile memory device 120 may provide the memory controller 110 with sampling values of the cell count corresponding to the sampling read voltages R0 and R1, based on the sampling read results.

The memory controller 110 may provide the nonvolatile memory device 120 with the iterative sampling read command ISR CMD for obtaining a plurality of sampling values corresponding to the cell count CC1 in the same manner as described above. That is, the memory controller 110 may request the nonvolatile memory device 120 to perform sensing with respect to sampling read voltages R1 and R2 as many as a predefined sampling read frequency and to provide a plurality of sampling values corresponding to the cell count CC1. In this case, the nonvolatile memory device 120 may perform a sensing operation with the sampling read voltages R1 and R2 as many as a predefined frequency. The nonvolatile memory device 120 may output a plurality of sampling values corresponding to the cell count CC1, based on the sensing results. With the above-described manner, the memory controller 110 may receive a plurality of sampling values corresponding to each of the cell counts CC0, CC1, CC2, CC3, and CC4 through the iterative sampling read operation.

Second of all, the memory controller 110 may perform a non-linear filtering operation with respect to the received sampling values corresponding to each of the cell counts CC0, CC1, CC2, CC3, and CC4. For example, the non-linear sampling operation may be performed such that there is removed a sampling value, which is excessively exposed to the noise, from among a plurality of sampling values corresponding to the cell count CC0. The last cell count CC0' may be generated using the filtering result. The non-linear filtering method may include a method for selecting a median of a plurality of sampling values, a threshold method for excluding a sampling value not included in a reference range, and the like. This will be described in detail with reference to the following flow charts.

Last cell counts CC0', CC1', CC2', CC3', and CC4' may be generated by the non-linear filtering scheme. The memory controller 110 may determine a read level corresponding to a valley VY0 by selecting a minimum value min_value among the last cell counts CC0', CC1', CC2', CC3', and CC4'.

A method for determining a valley or a read level using the sampling read operation of the disclosure is exemplified. However, the scope and spirit of the disclosure may not be limited thereto. For example, the memory controller 110 may provide a voltage range (e.g., R0 to R5) for the iterative sampling read operation and a voltage difference for calculating a cell count as the iterative sampling read command ISR CMD. In this case, the nonvolatile memory device 120 may automatically divide the whole voltage range into unit voltage ranges and may perform an iterative sampling read operation with respect to each of the unit voltage ranges. The nonvolatile memory device 120 may provide the memory controller 110 with a plurality of sampling values for each of the cell counts CC0, CC1, CC2, CC3, and CC4 as the result of the iterative sampling read operation. In addition, it may be appreciated that the nonvolatile memory device 120 provides the memory controller 110 with read data, not the cell counts CC0, CC1, CC2, CC3, and CC4, as a plurality of sampling values.

Figure 5:
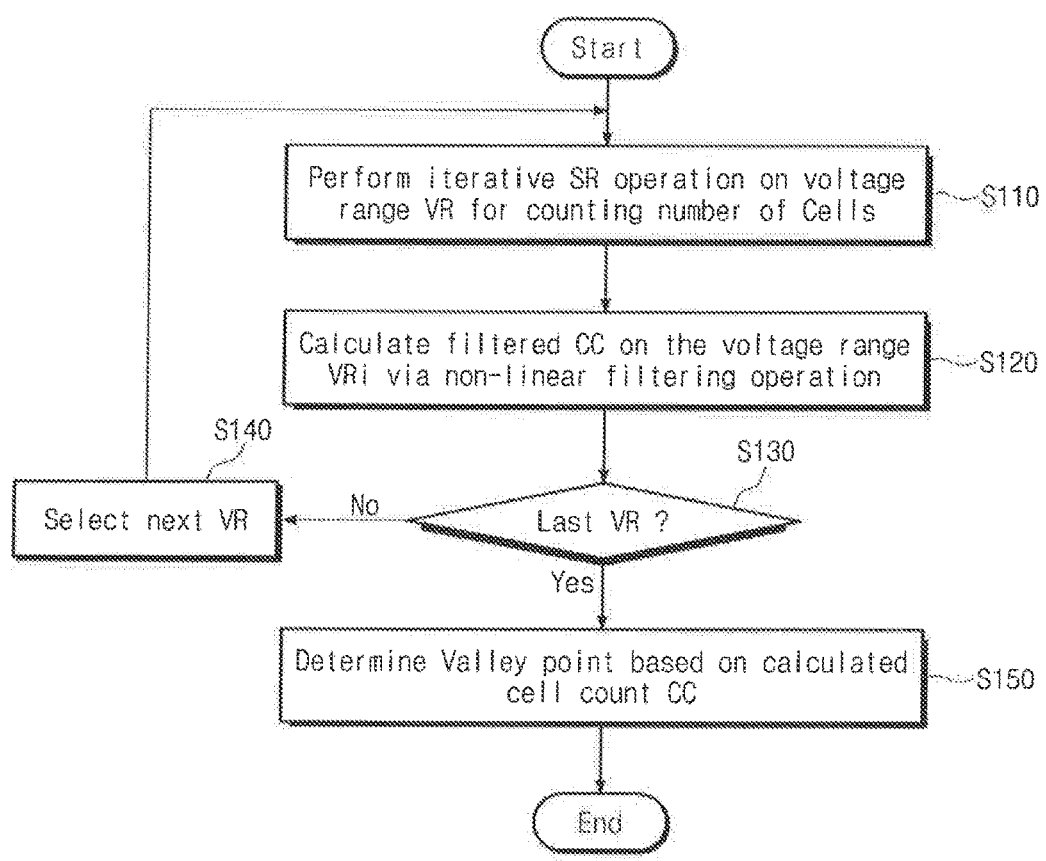
FIG. 5 is a flow chart illustrating an iterative sampling read method according to an embodiment of the disclosure.

FIG. 5 is a flow chart illustrating an iterative sampling read method according to an embodiment of the disclosure. A method in which the memory system 100 according to an embodiment of the disclosure performs an iterative sampling read operation and performs a non-linear filtering operation using a result of the sampling read operation will be described with reference to FIG. 5. In the case where an error such as a read fail occurs, an iterative sampling read operation and a non-linear filtering operation according to an embodiment of the disclosure may start to determine an optimized read voltage.

In step S110, the memory system 100 may request the iterative sampling read operation from the nonvolatile memory device 120 and may obtain a plurality of sampling values for the same voltage range as a result of the iterative sampling read operation. In particular, the memory controller 110 may provide the iterative sampling read command ISR CMD to the nonvolatile memory device 120. In this case, the nonvolatile memory device 120 may transfer a plurality of sampling values (e.g., a cell count) for a selected voltage range (VR) to the memory controller 110.

In step S120, the memory controller 110 may process a plurality of sampling values, corresponding to a cell count for the voltage range VR from the nonvolatile memory device 120, using a non-linear filtering operation. The memory controller 110 may select, for example, a median among a plurality of sampling values of a cell count corresponding to the same voltage range. Alternatively, the memory controller 110 may perform a filtering operation for excluding a sampling value(s), which is outside of a threshold range, from among a plurality of sampling values of a cell count corresponding to the same voltage range. The memory controller 110 may calculate the last cell count CCi' of a selected voltage range by selecting a median among sampling values included in the threshold range or calculating an average value.

The non-linear filtering operation may not be limited to the method for excluding a specific sampling value using a scheme in which a median is selected or a threshold range is used. Various non-linear filtering operations for excluding a sampling value determined as being a value distorted due to the noise may be used as a non-linear filtering operation according to an embodiment of the disclosure. In addition, it should be appreciated that a linear filtering operation is further used after the non-linear filtering operation to improve the degree of accuracy.

In step S130, the memory controller 110 may determine whether a voltage range corresponding to the iterative sampling read operation performed in steps S110 and S120 is the last voltage range. If the voltage range corresponding to the iterative sampling read operation is not the last voltage range (No), the procedure may proceed to step S140, in which an iterative sampling read operation for a next voltage range is performed. In contrast, if the voltage range corresponding to the iterative sampling read operation is the last voltage range (Yes), the procedure may proceed to step S150.

In step S140, the memory controller 110 may select a next voltage range of the voltage range corresponding to the iterative sampling read operation performed in steps S110 and S120. That is, the procedure may return to step S110 to select a next voltage range VRi+1 and provide the iterative sampling read command ISR CMD to the nonvolatile memory device 120.

In step S150, the memory controller 110 may determine a valley using the last sampling value CCi' for each of a plurality of sampling read ranges. The memory controller 110 may determine an adjusted read voltage for discriminating two distributions using a voltage level corresponding to the determined valley.

An iterative sampling read operation for discriminating two distributions S1 and S2 is described above. The above-described procedure may be iteratively used to search for valleys among a plurality of distributions. An embodiment of the disclosure is exemplified in which the memory controller 110 provides a sampling read command once to perform an iterative sampling read operation for one voltage range VR. However, the scope and spirit of the disclosure may not be limited thereto. For example, for an iterative sampling read operation of the same voltage range VR, the memory controller 110 may provide the nonvolatile memory device 120 with the number of sampling read commands corresponding to the number of cell counts to be outputted. Alternatively, for a sampling read operation for discriminating two distributions, a sampling read command may be once provided to the nonvolatile memory device 120.

Figure 6A:
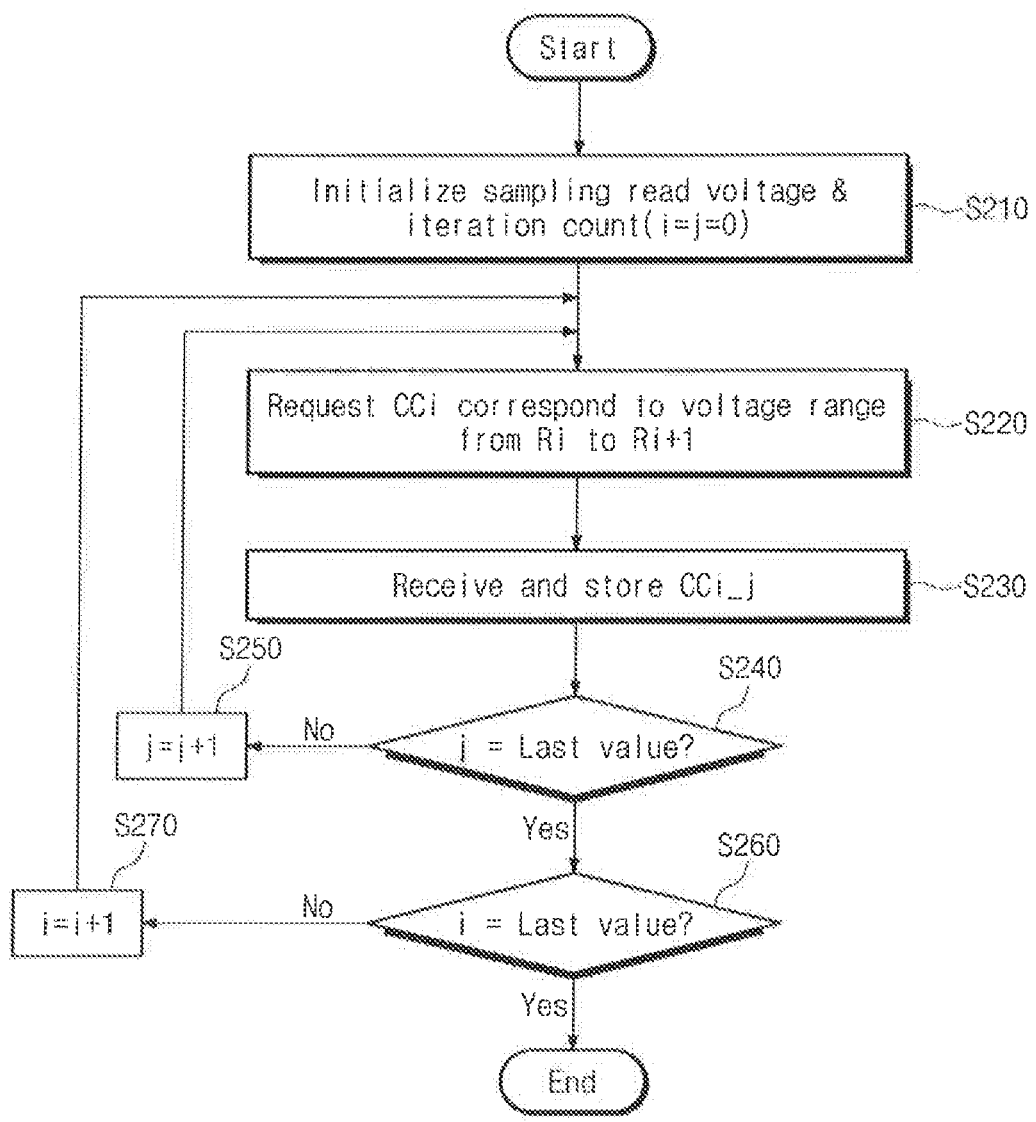
FIGS. 6A and 6B are flow charts illustrating an iterative sampling read method.
Figure 6B:
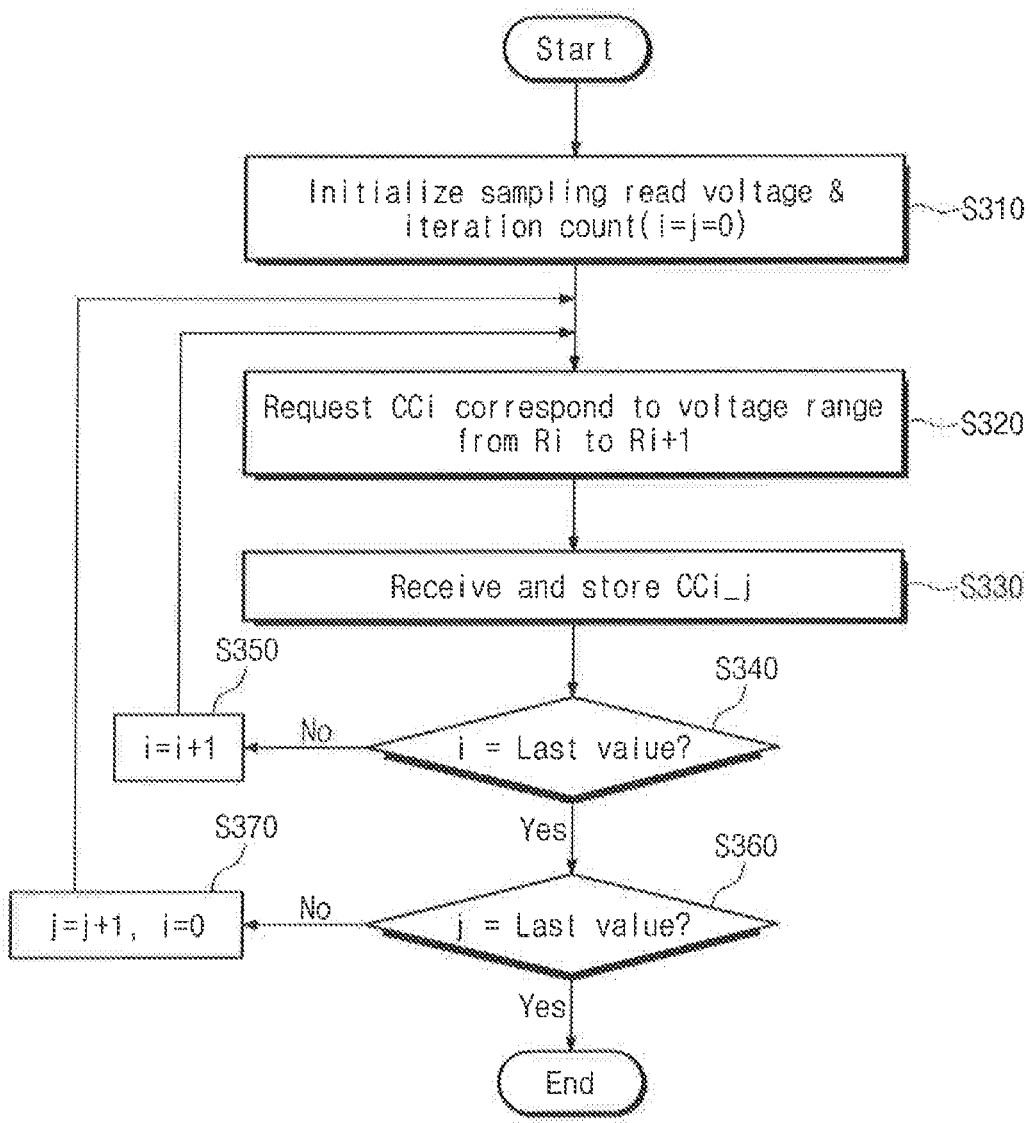

FIGS. 6A and 6B are flow charts illustrating an iterative sampling read method. FIG. 6A shows a manner to obtain a cell count CC1_j by iteratively performing sampling with respect to a unit voltage range VR. In contrast, FIG. 6B shows a manner to sequentially perform a sampling read operation with respect to each of unit voltage ranges VR of the whole voltage range R0 to R5 to which a sampling read operation is applied, such a sampling read operation being iteratively performed several times.

Referring to FIG. 6A, an iterative sampling read operation may be performed in such a way that sampling is iteratively performed with respect to a unit voltage range VR by a predefined frequency (i.e., number of times).

In step S210, the memory controller 110 may initialize sampling read voltages R0 to Rn and an iterative sampling frequency for a voltage range in which a sampling read operation is to be performed. That is, the memory controller 110 may initialize a cell count index "i" indicating a unit voltage range of the whole voltage range R0 to Rn and a sampling count "j" indicating an iterative sampling frequency for the unit voltage range. The sampling count "j" may correspond to a frequency (i.e., number of times) by which sampling is performed in the same voltage range.

In step S220, the memory controller 110 may transfer a sampling command for a sampling value CCi to the nonvolatile memory device 120. For example, the memory controller 110 may request the nonvolatile memory device 120 to sample a cell count for a unit voltage range R0 to R1. In this case, the nonvolatile memory device 120 may sense selected memory cells with the sampling read voltage R0 and may latch the sensed data. In addition, the nonvolatile memory device 120 may sense selected memory cells with the sampling read voltage R1 and may latch the sensed data. The nonvolatile memory device 120 may count the number of 1s by performing an exclusive OR operation for data sensed using the read voltages R0 and R1. The nonvolatile memory device 120 may transfer the counted value to the memory controller 110 as a sampling value corresponding to the sampling count j of 0.

In step S230, the memory controller 110 may receive a sampling value CC0_0 from the nonvolatile memory device 120. The sampling value CC0_0 may be a first sampling value for the unit voltage range R0 to R1. The sampling value CC0_0 may be stored in the memory controller 110 (or at a specific area thereof).

In step S240, the memory controller 110 may determine whether the sampling value CC0_0 sampled and stored in steps S220 and S230 is the last sampling value for the unit voltage range R0 to R1. That is, the memory controller 110 may determine whether the sampling count j corresponds to a predefined sampling frequency (i.e., predefined sampling count). If the sampling count j is not the predefined sampling frequency for the unit voltage range R0 to R1, the procedure may proceed to step S250. If the sampling count j is the predefined sampling frequency for the unit voltage range R0 to R1, the procedure may proceed to step S260.

In step S250, the memory controller 110 may increase the sampling count j for the unit voltage range R0 to R1. That is, if a current sampling count j is an initial value of 0, the memory controller 110 may increase the sampling count j by 1 so as to have a new value of 1. Afterwards, the procedure may proceed to step S220 in which second sampling for the unit voltage range R0 to R1 is performed.

In step S260, the memory controller 110 may determine whether an iterative sampling read operation for the unit voltage range R0 to R1 corresponds to the last unit voltage range of the whole voltage range. That is, the memory controller 110 may determine whether a sampling value outputted according to the iterative sampling read operation completed in step S240 corresponds to the last unit voltage range (e.g., R4 to R5). That is, the memory controller 110 may determine whether the sampling value corresponds to the last sampling value of a cell count CC4. For example, whether the sampling value corresponds to the last value of a cell count CC4 may be determined based on whether a cell count index i is the last value. If the cell count index i corresponds to the last value, the overall iterative sampling read operation may end. In contrast, if the cell count index i does not correspond to the last value, the procedure may proceed to step S270 to perform an iterative sampling read operation for a next unit voltage range.

In step S270, the memory controller 110 may change a unit voltage range and may increase the cell count index i to perform the iterative sampling read operation. That is, if a current cell count index i is an initial value of 0, the memory controller 110 may increase the cell count index i by 1 so as to have a new value of 1. Afterwards, the procedure may proceed to step S220 in which second sampling for the unit voltage range R1 to R2 is performed.

An iterative sampling read method is exemplified in which a sampling read operation is iteratively performed with respect to the same unit voltage range.

FIG. 6B is a flow chart illustrating an iterative sampling read operation according to another embodiment of the disclosure. A method in which an iterative sampling read operation is implemented in such a way that there is iteratively performed a process in which the memory controller 110 sequentially performs a sampling operation with respect to unit voltage ranges will be described with reference to FIG. 6B.

In step S310, the memory controller 110 may initialize a cell count index i and a sampling count j. Also, the memory controller 110 may be able to set an address for memory cells where an iterative sampling read operation is to be performed, the whole range of a sampling read voltage, and the like.

In step S320, the memory controller 110 may transfer a sampling command for a cell count CCi to the nonvolatile memory device 120. For example, the memory controller 110 may request the nonvolatile memory device 120 to sample a cell count for a unit voltage range R0 to R1. In this case, the nonvolatile memory device 120 may sense selected memory cells with the sampling read voltage R0 and may latch the sensed data. In addition, the nonvolatile memory device 120 may sense selected memory cells with the sampling read voltage RI and may latch the sensed data. The nonvolatile memory device 120 may calculate a sampling value CCO_0 using data sensed using the read voltages R0 and R1 and may transfer the calculated sampling value CC0_0 to the memory controller 110.

In step S330, the memory controller 110 may receive a sampling value CC0_0 from the nonvolatile memory device 120. The sampling value CC0_0 may be a first sampling value of a cell count CC0 for the unit voltage range R0 to R1. The sampling value CC0_0 may be stored in the memory controller 110 (or at a specific area thereof).

In step S340, the memory controller 110 may determine whether the sampling value CC0_0 sampled and stored in steps S320 and S330 is the last unit voltage range of the whole sampling read voltage range. That is, the memory controller 110 may determine whether the cell count index i corresponds to a predefined last value. If the cell count index i is not the predefined last value, the procedure may proceed to step S350. In contrast, if the cell count index i is the predefined last value, the procedure may proceed to step S360.

In step S350, the memory controller 110 may increase the cell count index i. Afterwards, the procedure may proceed to step S320. In step S320, a sampling read operation for a next unit voltage range R1 to R2 may be performed.

In step S360, the memory controller 110 may determine whether a current sampling count j corresponds to a predefined last value. If a current sampling count j is not the last value, the procedure may proceed to step S370 to increase the sampling count j. If a current sampling count j corresponds to the last value, the overall iterative sampling read operation may end.

In step S370, the memory controller 110 may increase the sampling count j and reinitialize the cell count index i to zero ('0'). Afterwards, the procedure may proceed to step S320.

Various iterative sampling read methods are exemplified in which a sampling read operation is iteratively performed with respect to the same unit voltage range. A method for sampling a sampling value corresponding to a unit voltage range several times may not be limited to the above-described method. A sampling value corresponding to a unit voltage range may be sampled several times in various manners.

FIG. 7 is a diagram illustrating a non-linear filtering manner according to an embodiment of the disclosure. Referring to FIG. 7, there may be selected a median among a plurality of sampling values sampled in the same voltage range. This will be described in more detail below.

The memory controller 110 may receive sampling values for each cell count CCi from the nonvolatile memory device 120. It may be assumed that the memory controller 110 receives a sampling value of 1750, obtained through a first sampling read operation SR1, from among a plurality of sampling values corresponding to a cell count CC0, a sampling value of 1680, obtained through a second sampling read operation SR2, from among the sampling values, a sampling value of 1480, obtained through a third sampling read operation SR3, from among the sampling values, a sampling value of 1760, obtained through a fourth sampling read operation SR4, from among the sampling values, and a sampling value of 1755, obtained through a fifth sampling read operation SR5, from among the sampling values. Likewise, it may be assumed that the memory controller 110 receives sampling values of 1595, 1610, 1590, 1600, and 1615 for a cell count CC1 obtained through the iterative sampling read operation. Also, it may be assumed that in the above-described manner, the memory controller 110 receives sampling values of 1490, 1500, 1505, 1300, and 1495 for a cell count CC2, sampling values of 1402, 1413, 1395, 1425, and 1409 for a cell count CC3, and sampling values of 1502, 1498, 1489, 1505, and 1520 for a cell count CC4 from the nonvolatile memory device 120.

Based on the above-described iterative sampling read result, the memory controller 110 may perform a non-linear filtering operation to select a median among sampling values of each cell count as a representative value. For example, the memory controller 110 may select a median among the sampling values 1750, 1680, 1480, 1760, and 1755 for the cell count CC0 as the last cell count CC0'. That is, the memory controller 110 may select a sampling value of 1750, which corresponds to an intermediate level, from among the sampling values for the cell count CC0 as the last cell count CC0'. In the case where a median is selected, influence of a relatively low sampling value of 1480 due to the noise may be reduced.

Likewise, in the case where a median is selected, "1600" among sampling values for the cell count CC1, "1495" among sampling values for the cell count CC2, "1409" among sampling values for the cell count CC3, and "1502" among sampling values for the cell count CC4 may be selected. The memory controller 110 may select "1409", which corresponds to a minimum value, from among the medians as a cell count corresponding to a valley.

Figure 8A:
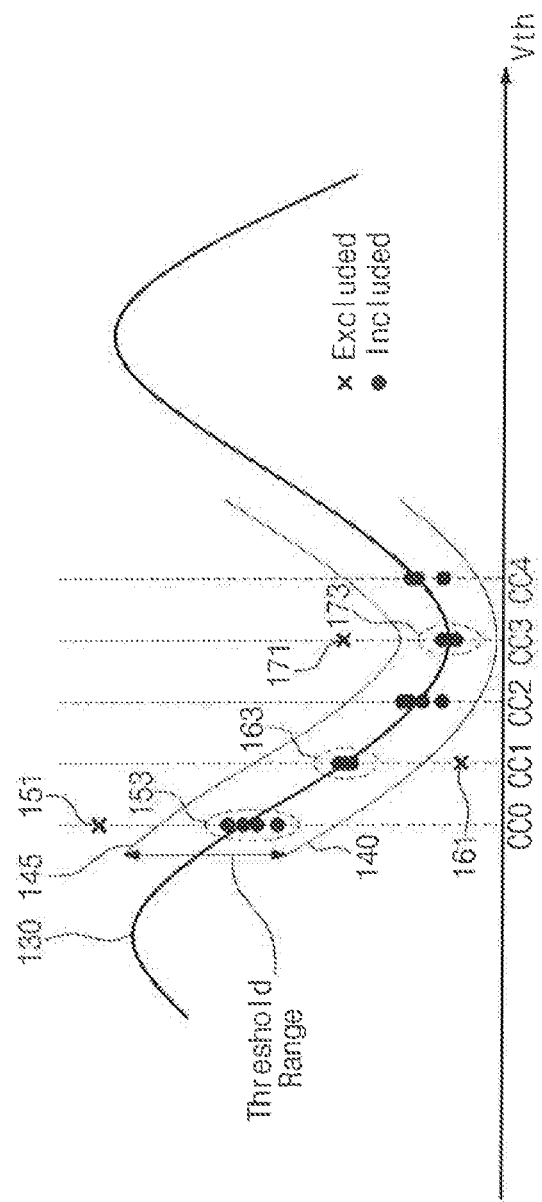
FIG. 8A is a diagram illustrating a non-linear filtering manner according to another embodiment of the disclosure.

FIG. 8A is a diagram illustrating a non-linear filtering manner according to another embodiment of the disclosure. Referring to FIG. 8A, there may be excluded sampling values, which are distributed out of a threshold range, from among a plurality of sampling values sampled in the same unit voltage range. A sampling value for each unit voltage range may be determined by performing non-linear processing of the selected sampling values.

In FIG. 8A, it may be assumed that a curve 130 indicates an actual threshold voltage distribution of memory cells. In this case, a threshold range may be defined by a lower curve 140 and an upper curve 145 of a cell count. The lower curve 140 and the upper curve 145 may be provided based on an experimental value or an empirical value according to degradation, retention, and disturbance of memory cells.

The memory controller 110 may exclude a sampling value 151, which is not included in a threshold range, from among sampling values of the cell count CC0. The last cell count CC0' may be determined by processing sampling values 153 distributed in the threshold range. For example, a median among the sampling values 153 may be determined as the last cell count CC0'.

The memory controller 110 may exclude a sampling value 161, which is not included in the threshold range, from among sampling values 161 and 163 of the cell count CC1. The memory controller 110 may exclude a sampling value 171, which is not included in the threshold range, from among sampling values 171 and 173 of the cell count CC3. With the above-described manner, it may be possible to exclude a sampling value, which is determined as being affected due to the noise, from among a plurality of sampling values obtained through the iterative sampling read operation according to an embodiment of the disclosure.

Figure 8B:
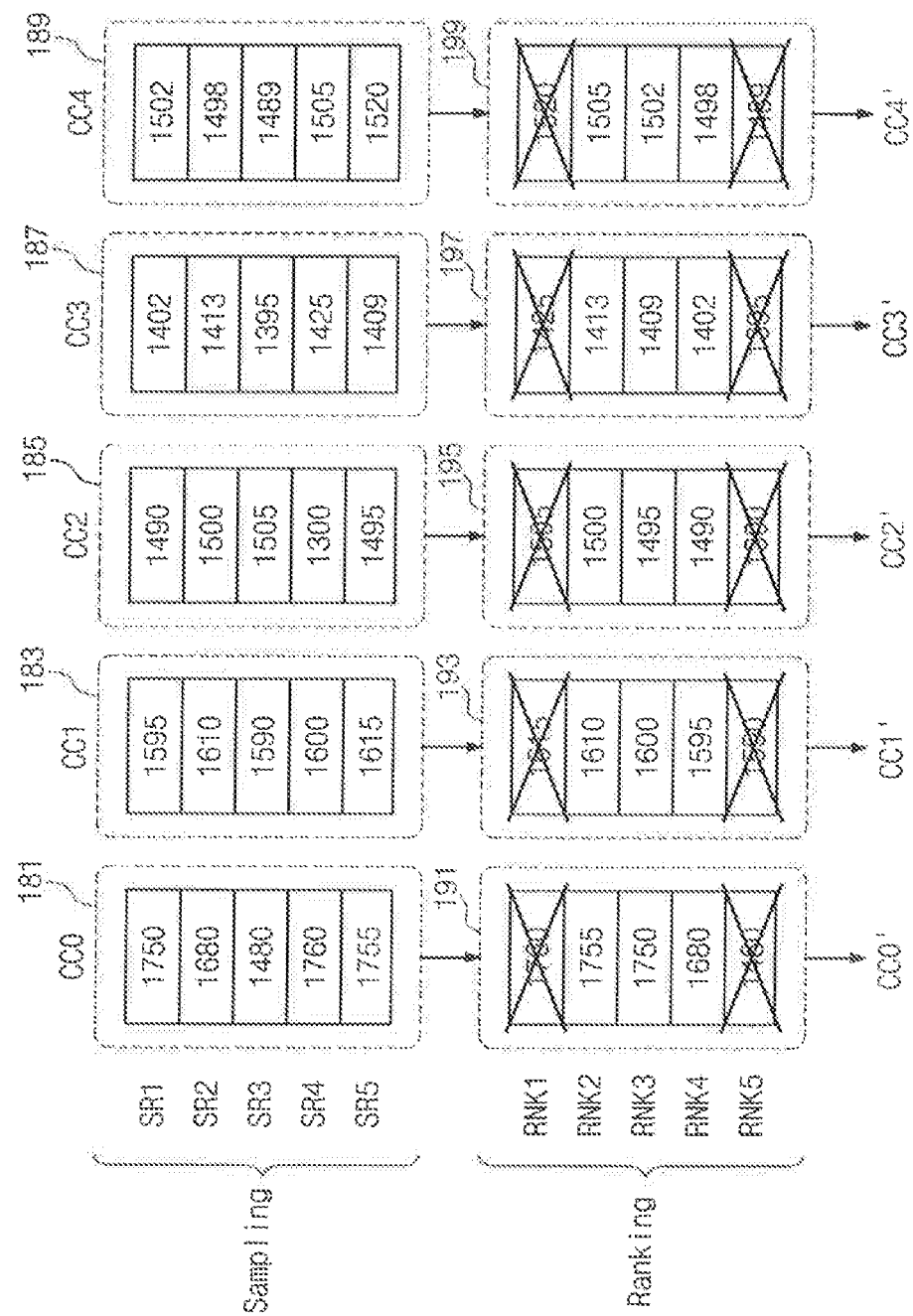
FIG. 8B is a diagram illustrating a non-linear filtering manner according to another embodiment of the disclosure.

FIG. 8B is a diagram illustrating a non-linear filtering manner according to another embodiment of the disclosure. Referring to FIG. 8B, a plurality of sampling values sampled in the same voltage range may be ranked according to magnitude. A sampling value for each unit voltage range may be determined by selecting sampling values corresponding to a specific rank and performing non-linear processing for the selected sampling values.

The memory controller 110 may exclude sampling values 1750 and 1480, which correspond to specific ranks RNK1 and RNK5, from among sampling values 181 of the cell count CC0. An embodiment of the disclosure is exemplified as sampling values, which correspond to the uppermost rank RNK1 and the lowermost rank RNK5, from among sampling values 181 are excluded. This selection manner may be only an example. The last cell count CC0' may be determined by processing sampling values 191 corresponding to ranks RNK2, RNK3, and RNK4.

The memory controller 110 may exclude sampling values 1615 and 1590, which correspond to specific ranks RNK1 and RNK5, from among sampling values 183 of the cell count CC1. The last cell count CC1' may be determined by processing sampling values 193 corresponding to ranks RNK2, RNK3, and RNK4. There may be excluded sampling values 1505 and 1300, which correspond to specific ranks RNK1 and RNK5, from among sampling values 185 of the cell count CC2. The last cell count CC2' may be determined by processing sampling values 195 corresponding to ranks RNK2, RNK3, and RNK4. There may be excluded sampling values 1425 and 1395, which correspond to specific ranks RNK1 and RNK5, from among sampling values 187 of the cell count CC3. The last cell count CC3' may be determined by processing sampling values 197 corresponding to ranks RNK2, RNK3, and RNK4. There may be excluded sampling values 1520 and 1489, which correspond to specific ranks RNK1 and RNK5, from among sampling values 189 of the cell count CC4. The last cell count CC4' may be determined by processing sampling values 199 corresponding to ranks RNK2, RNK3, and RNK4. With the above-described manner, it may be possible to exclude a sampling value, which is determined as being affected due to the noise, from among a plurality of sampling values obtained through the iterative sampling read operation according to an embodiment of the disclosure.

Figure 9:
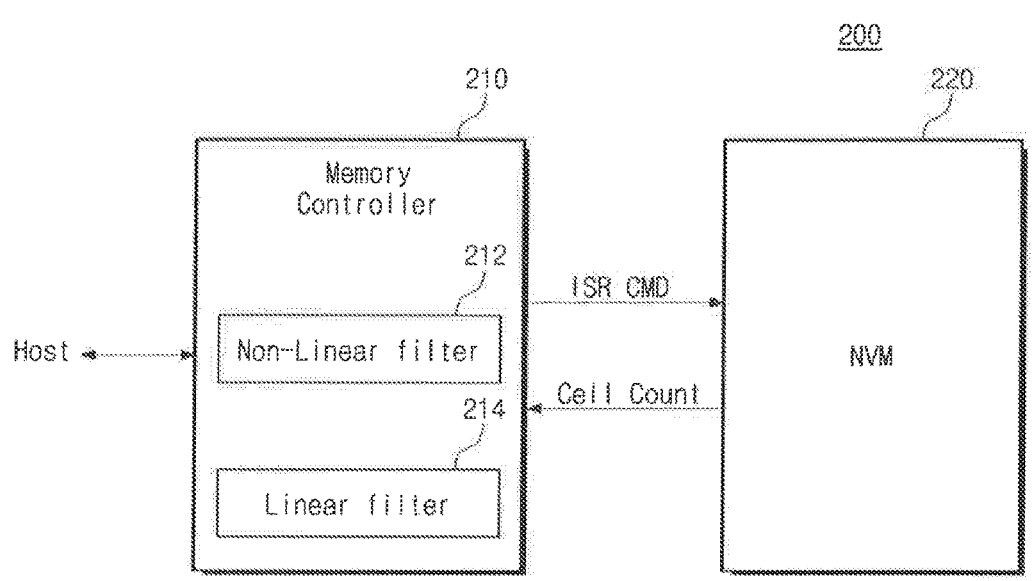
FIG. 9 is a block diagram illustrating a memory system according to another embodiment of the disclosure.

FIG. 9 is a block diagram illustrating a memory system according to another embodiment of the disclosure. Referring to FIGS. 9, a memory system 200 may include a memory controller 210 and a nonvolatile memory device 220. An iterative sampling read operation by the memory controller 210 and the nonvolatile memory device 220 may be substantially the same as that of FIG. 1, and a detailed description of the iterative sampling read operation and the nonvolatile memory device 220 is thus omitted.

The memory controller 210 may provide the iterative sampling read command ISR CMD to the nonvolatile memory device 220. The nonvolatile memory device 220 may output a cell count, Cell Count, of the same voltage range with a plurality of sampling values in response to the iterative sampling read command ISR CMD. The memory controller 210 may perform non-linear filtering and the following linear filtering for a plurality of sampling values. Here, a median selection manner or a threshold-range-applying-manner described with reference to FIGS. 6 and 7 may be applied to the non-linear filtering. The linear filtering may be implemented using a typical linear arithmetic operation such as a weighted averaging operation or a weightless averaging operation. The memory controller 210 may include a non-linear filter 212 for non-linear filtering and a linear filter 214 for linear filtering. The non-linear filter 212 and the linear filter 214 may be implemented with an algorithm or software module driven on the memory controller 210.

Figure 10:
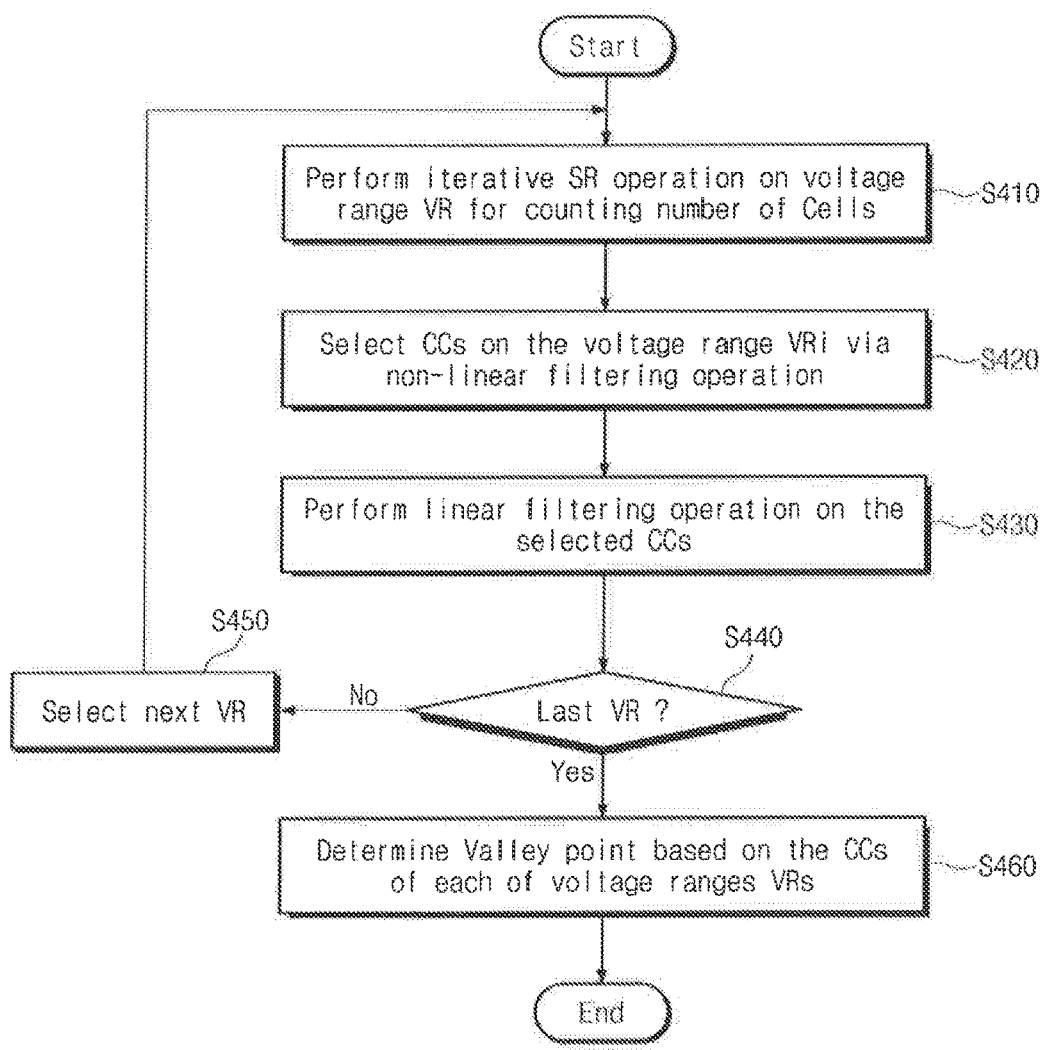
FIG. 10 is a flow chart illustrating a method for processing a result of an iterative sampling read operation according to another embodiment of the disclosure.

FIG. 10 is a flow chart illustrating a method for processing a result of an iterative sampling read operation according to another embodiment of the disclosure. A method in which the memory system 200 according to an embodiment of the disclosure performs an iterative sampling read operation and performs a non-linear filtering operation using a result of the sampling read operation will be described with reference to FIG. 10. The memory controller 210 may perform a linear filtering operation for a result of the non-linear filtering operation.

In step S410, the memory system 200 may request the iterative sampling read operation from the nonvolatile memory device 220 and may obtain a plurality of sampling values for the same voltage range as a result of the iterative sampling read operation. The memory controller 210 may provide the iterative sampling read command ISR CMD to the nonvolatile memory device 220. In this case, the nonvolatile memory device 220 may transfer a plurality of sampling results (e.g., sampling values) for a unit voltage range VR to the memory controller 210.

In step S420, the memory controller 210 may process a plurality of sampling values, which correspond to a unit voltage range VR and are received from the nonvolatile memory device 220, using a non-linear filtering operation. The memory controller 210 may select, for example, a median among a plurality of sampling values corresponding to the unit voltage range. Alternatively, the memory controller 210 may perform a filtering operation to exclude sampling values, which are not included in a threshold range or a specific ranking range, from among a plurality of sampling values for the same voltage range. A statistical processing manner or an arithmetic operation manner may be applied to the non-linear filtering operation.

In step S430, the memory controller 210 may additionally apply a linear filtering operation to data processed by the non-linear filtering operation. For example, there may be performed a linear filtering operation such as an averaging operation to apply a weight to sampling values included in a threshold range.

In step S440, the memory controller 210 may determine whether a voltage range corresponding to the iterative sampling read operation performed in steps S410 to S430 is the last voltage range. If the voltage range corresponding to the iterative sampling read operation is not the last voltage range (No), the procedure may proceed to step S450, in which an iterative sampling read operation for a next voltage range is performed. In contrast, if the voltage range corresponding to the iterative sampling read operation is the last voltage range (Yes), the procedure may proceed to step S460.

In step S450, the memory controller 210 may select a next voltage range to change a target voltage range of the iterative sampling read operation. Afterwards, the procedure may return to step S410 to select a next voltage range VR and provide the iterative sampling read command ISR CMD to the nonvolatile memory device 220.

In step S460, the memory controller 210 may determine a valley using the last sampling value CCi' for each of a plurality of sampling read ranges. The memory controller 210 may determine a read voltage for discriminating two distributions using a voltage level corresponding to the determined valley.

Another embodiment in which there is processed a result of an iterative sampling read operation to determine a valley is described above.

Figure 11:
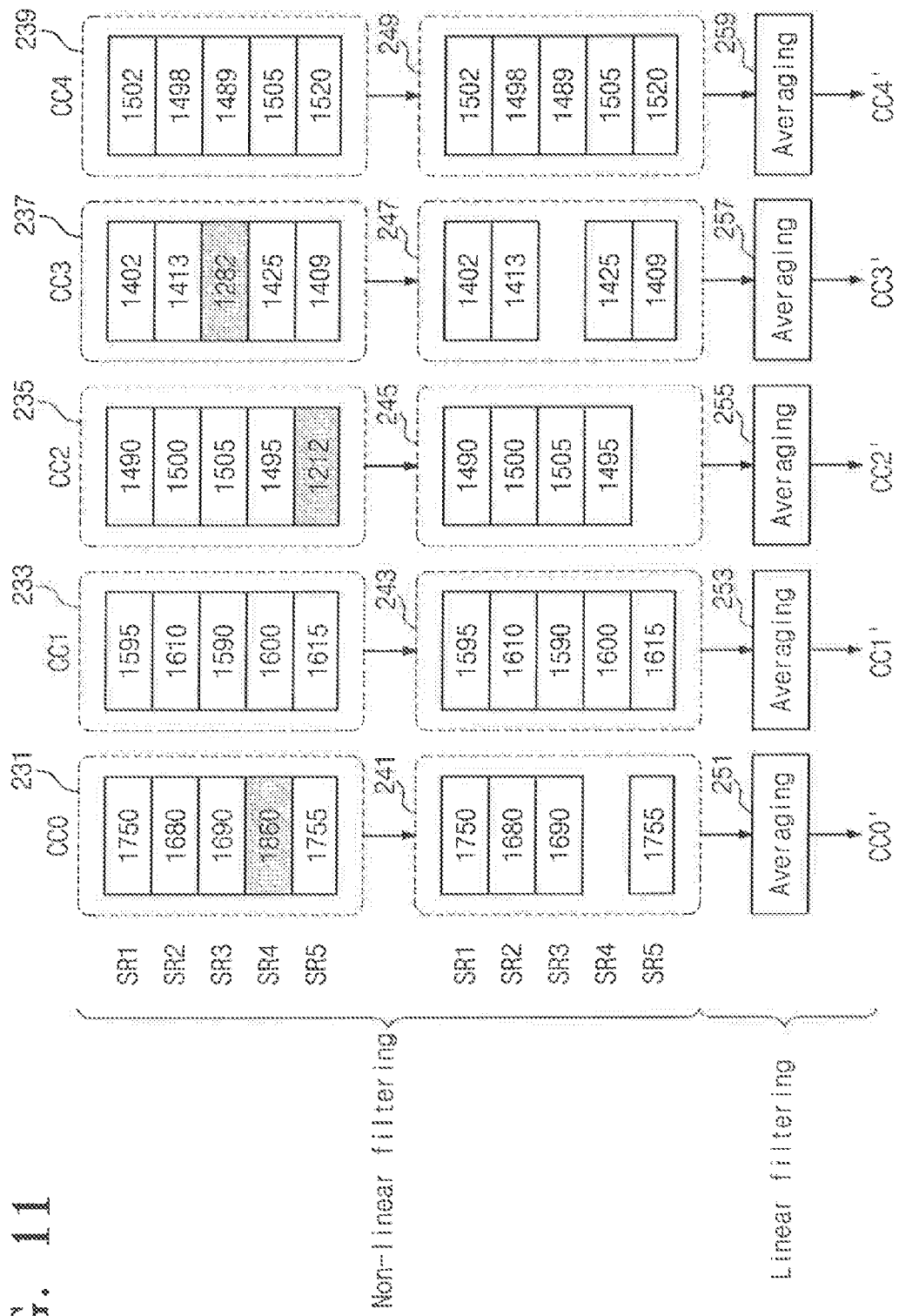
FIG. 11 is a diagram illustrating a method in which non-linear filtering and linear filtering described with reference to FIG. 10 are continuously performed.

FIG. 11 is a diagram illustrating a method in which non-linear filtering and linear filtering described with reference to FIG. 10 are continuously performed. Referring to FIG. 11, the noise of a cell count obtained through an iterative sampling read operation may be removed through a non-linear filtering operation. A cell count may be processed through the following linear filtering operation to have a value for estimating a valley more accurately.

Each of the cell counts CC0, CC1, CC2, CC3, and CC4 may include five sampling values through the iterative sampling read operation. Referring to sampling values 231 of the cell count CC0, a sampling value 1860 may be determined as a value which is affected due to the noise. Accordingly, the sampling value 1860 may be excluded through the non-linear filtering operation. As a result, a sampling value 241 corresponding to the cell count CC0 may be selected through the non-linear filtering operation. Likewise, a sampling value 1212 among sampling values 235 corresponding to the cell count CC2 may be determined as a sample, which is affected due to the noise, through the non-linear filtering operation. Accordingly, the sampling value 1212 may be excluded through the non-linear filtering operation. As a result, a sampling value 245 corresponding to the cell count CC2 may be selected through the non-linear filtering operation. A sampling value 1282 among sampling values 237 corresponding to the cell count CC3 may be determined as a sample, which is affected due to the noise, through the non-linear filtering operation. Accordingly, the sampling value 1282 may be excluded through the non-linear filtering operation. A sampling value 247 corresponding to the cell count CC3 may be selected through the non-linear filtering operation. In this example, no values are excluded among sampling values 233 and sampling values 239.

When the non-linear filtering operation is completed, linear filtering may be performed with respect to each of the selected sampling values 241, 243, 245, 247, and 249. For example, there may be performed an averaging operation in which different weights are applied to the selected sampling values. Cell counts CC0, CC1, CC2, CC3, and CC4 obtained through the iterative sampling read operation may be outputted as cell counts CC0', CC1', CC2', CC3', and CC4' by averaging operations 251, 253, 255, 257, and 259.

Figure 12:
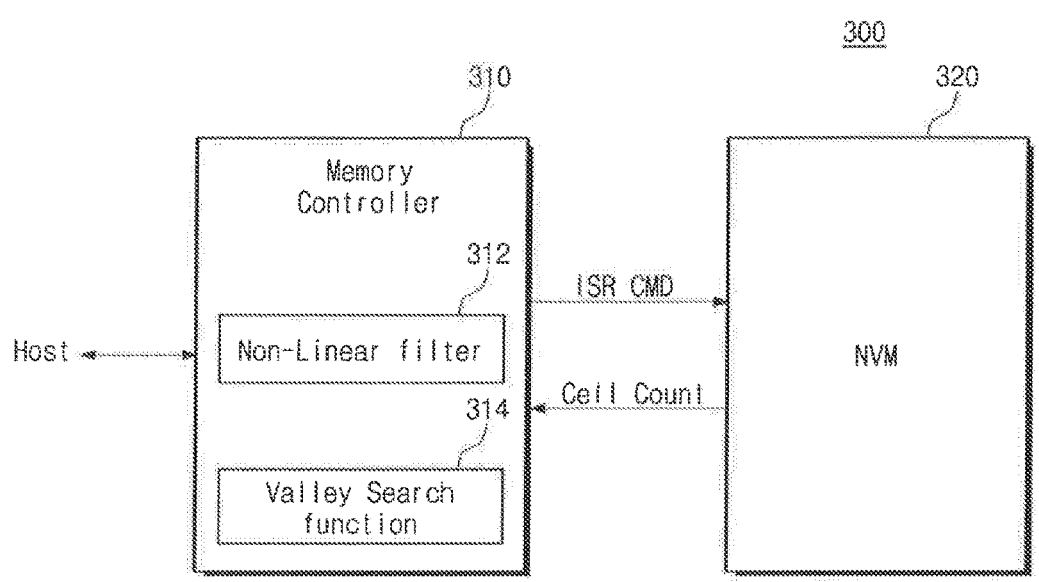
FIG. 12 is a block diagram illustrating a memory system according to still another embodiment of the disclosure.

FIG. 12 is a block diagram illustrating a memory system according to still another embodiment of the disclosure. Referring to FIG. 12, a memory system 300 may include a memory controller 310 and a nonvolatile memory device 320. An iterative sampling read operation by the memory controller 310 and the nonvolatile memory device 320 may be substantially the same as that of FIG. 1. A detailed description of the iterative sampling read operation and the nonvolatile memory device 320 is thus omitted.

The memory controller 310 may provide the iterative sampling read command ISR CMD for estimating a valley to the nonvolatile memory device 320. First of all, the memory controller 310 may provide the iterative sampling read command ISR CMD to the nonvolatile memory device 320 so as to perform a sampling read operation with respect to a surrounding voltage range of a read voltage RD. Here, the read voltage RD may be a read voltage prior to adjustment. In response to the iterative sampling read command ISR CMD, the nonvolatile memory device 320 may provide a sampling value (a cell count) of voltage ranges, which are defined with the read voltage RD as the center, using a plurality of sampling values.

The memory controller 310 may process a plurality of sampling values in a non-linear filtering scheme. The memory controller 310 may determine sampling values placed at the right and the left with the read voltage RD as the center. The memory controller 310 may estimate a valley shift direction with reference to the determined sampling values. The memory controller 310 may additionally sample sampling values for a plurality of unit voltage ranges along the valley shift direction. To this end, the memory controller 310 may include a non-linear filter 312 and a valley search function part 314.

An embodiment of the disclosure is exemplified in which an iterative sampling read operation is applied to an operation to determine a valley shift direction. Iterative sampling and non-linear filtering of sampling values may be applied to determine a valley shift direction, thereby improving the reliability. In the case where a valley shift direction is erroneously determined due to the noise, a fatal operation error and a decrease in performance may occur. Accordingly, as the iterative sampling and non-linear filtering are applied to determine a valley shift direction, it may be possible to improve the reliability associated with a determination of the valley shift direction and the performance associated with adjustment of a read voltage.

Figure 13:
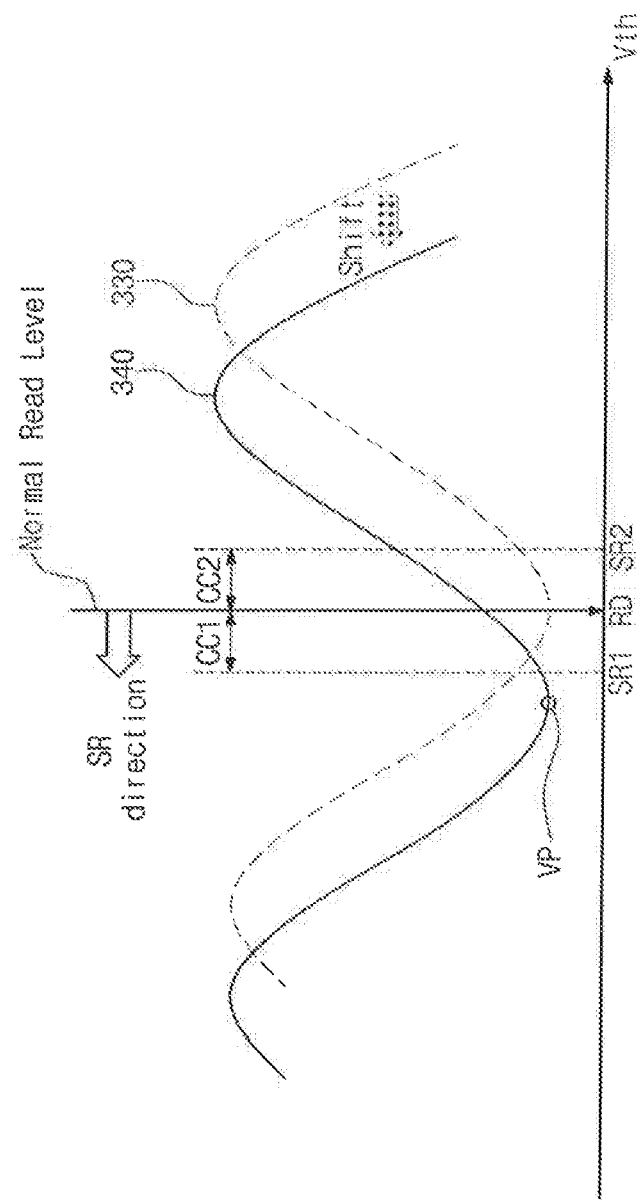
FIG. 13 is a diagram illustrating an operation for determining a valley shift direction, according to an embodiment of the disclosure.

FIG. 13 is a diagram illustrating an operation for determining a valley shift direction, according to an embodiment of the disclosure. Referring to FIG. 13, an iterative sampling read operation according to an embodiment of the disclosure may be applied to an operation for detecting a valley shift direction.

A dotted curve 330 may indicate a threshold voltage distribution of memory cells before a valley shift occurs, for example, when a program operation is performed for the first time. A solid curve 340 may indicate a threshold voltage distribution after a valley shift occurs. In this case, a lot of error bits may occur when selected memory cells are sensed using a typical read voltage RD. This may mean that a read fail occurs. Accordingly, a need exists to detect a valley and adjust a level of a read voltage based on the detected valley.

To determine a position of a valley, first of all, a direction to read a valley may be determined. The memory controller 310 may perform an iterative sampling read operation using a sampling read voltage SR1 and a sampling read voltage SR2 with the read voltage RD as the center. That is, the memory controller 310 may detect the number of memory cells included in a unit voltage range SR1 to RD through the iterative sampling read operation. Likewise, the memory controller 310 may detect the number of memory cells included in a unit voltage range RD to SR2 through the iterative sampling read operation. The memory controller 310 may calculate cell counts CC1 and CC2 by performing a non-linear filtering operation for sampling values obtained the iterative sampling read operations. A cell count, which has a relatively small value, from among the cell counts CC1 and CC2 may be determined as a valley (VP) shift direction.

Afterwards, the memory controller 310 may perform a sampling read operation for detecting an accurate valley position based on the valley shift direction.

Figure 14:
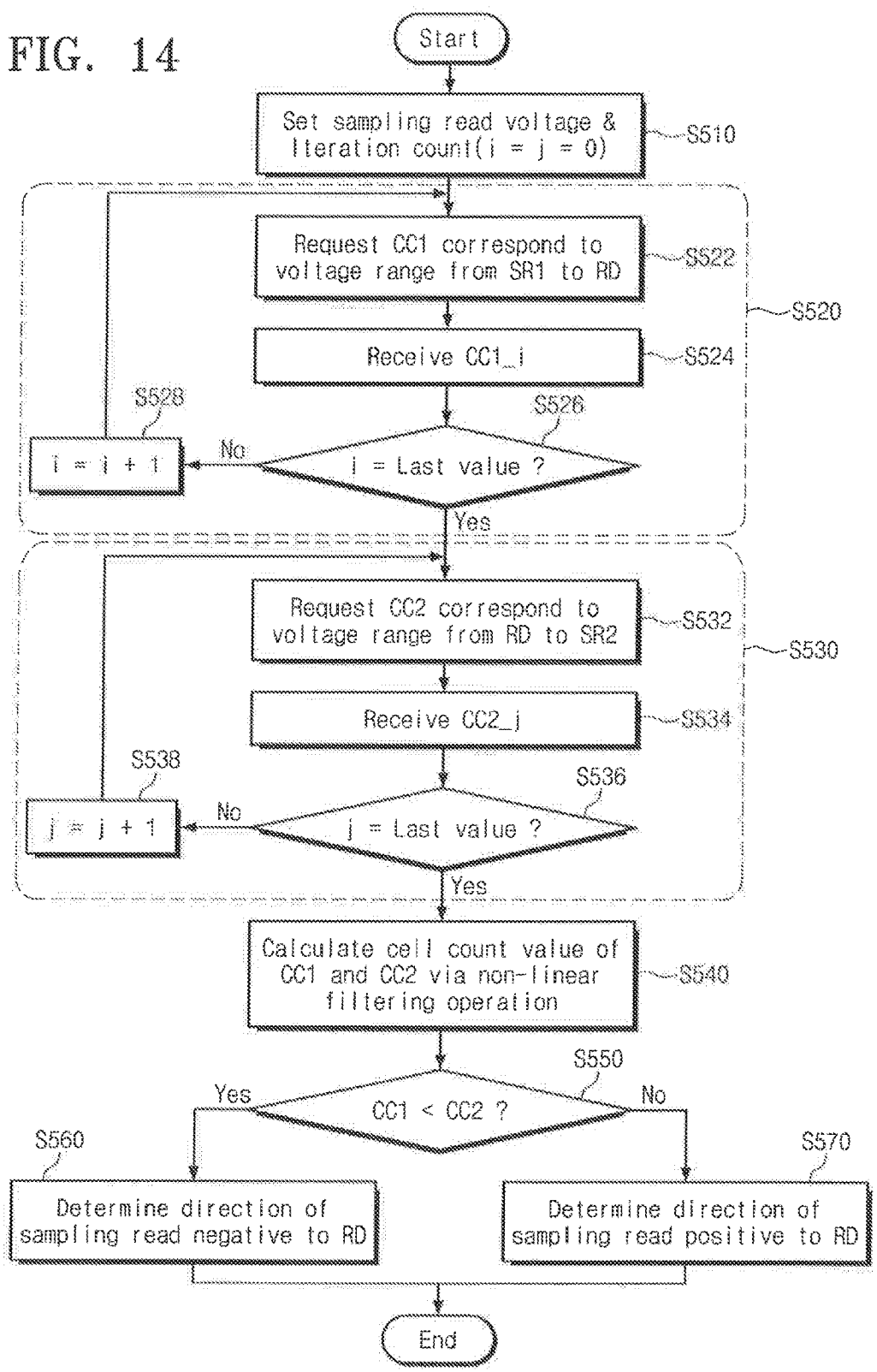
FIG. 14 is a flow chart illustrating a method for processing a result of an iterative sampling read operation to detect a valley shift direction, according to an embodiment of the disclosure.

FIG. 14 is a flow chart illustrating a method for processing a result of an iterative sampling read operation to detect a valley shift direction, according to an embodiment of the disclosure. Referring to FIG. 14, the memory system 300 may determine a valley shift direction by performing an iterative sampling read operation and performing a non-linear filtering operation using a result of the sampling read operation.

In step S510, the memory system 300 may initialize settings of a sampling read operation for determining a valley shift direction. For example, a first sampling read voltage SR1 of which the magnitude is smaller than that of the read voltage RD and a second sampling read voltage SR2 of which the magnitude is greater than that of the read voltage RD may be set. The number of sampling operations to be performed in each voltage range may be determined. In FIG. 14, "i" may refer to a value indicating the number of sampling operations to be performed in a voltage range between the first sampling read voltage SR1 and a typical read voltage RD. "j" may refer to a value indicating the number of sampling operations to be performed in a voltage range between the read voltage RD and the second sampling read voltage SR2.

In step S520, the memory system 300 may perform an iterative sampling read operation in a voltage range between the first sampling read voltage SR1 and the read voltage RD. This operation may be composed of steps S522, S524, S526, and S528 which constitute an operation loop. In step S522, the memory controller 310 may provide the nonvolatile memory device 320 with a sampling read command ISR CMD for a voltage range between the first sampling read voltage SRI and the read voltage RD. In step S524, the nonvolatile memory device 320 may transfer a first cell count CCL_0 sampled to the memory controller 310. The memory controller 310 may store the first-first cell count CC1_0. In step S526, the memory controller 310 may determine whether a current value of i corresponds to a predefined last value. If a current value of i corresponds to the predefined last value (Yes), the procedure may proceed to step S530. In contrast, if a current value of i is not the predefined last value (No), the procedure may proceed to step S528. An operation loop for sampling a second-first cell count CC1_1 may be repeated.

In step S530, the memory system 300 may perform an iterative sampling read operation in a voltage range between the read voltage RD and the second sampling read voltage SR2. This operation may be composed of steps S532, S534, S536, and S538 which constitute an operation loop. In step S532, the memory controller 310 may provide the nonvolatile memory device 320 with a sampling read command ISR CMD for a voltage range between the read voltage RD and the second sampling read voltage SR2. In step S534, the nonvolatile memory device 320 may transfer a second cell count CC20 sampled to the memory controller 310. The memory controller 310 may store the first-second cell count CC2_0. In step S536, the memory controller 310 may determine whether a current value of j corresponds to a predefined last value. If a current value of j corresponds to the predefined last value (Yes), the procedure may proceed to step S540. In contrast, if a current value of j is not the predefined last value (No), the procedure may proceed to step S538. An operation loop for sampling a second-second cell count CC2_1 may be repeated.

In step S540, the memory controller 310 may process the first cell counts CC_i, which are obtained in step S520, in a non-linear filtering manner to determine the magnitude of the first cell count CC1. The memory controller 310 may process the second cell counts CC2_i, which are obtained in step S530, in a non-linear filtering manner to determine the magnitude of the second cell count CC2.

In step S550, the memory controller 310 may compare the magnitude of the first cell count CC1 and the magnitude of the second cell count CC2. If the magnitude of the first cell count CC1 is smaller than the magnitude of the second cell count CC2 (Yes), the procedure may proceed to step S560. If the magnitude of the first cell count CC1 is not smaller than the magnitude of the second cell count CC2 (No), the procedure may proceed to step S570.

In step S560, the memory controller 310 may determine a valley shift direction as being shifted in a negative direction relative to the read voltage RD. Accordingly, a sampling read direction for determining a valley point may progress from a negative direction relative to the read voltage RD.

In step S570, the memory controller 310 may determine a valley shift direction as being shifted in a positive direction relative to the read voltage RD. Accordingly, a sampling read direction for determining a valley point may progress from a positive direction relative to the read voltage RD.

An embodiment in which a result of an iterative sampling read operation is processed in a non-linear filtering manner to determine a valley is described above. The above-described scheme may make it possible to determine a sampling value with high reliability through a non-linear filtering operation of an iterative sampling result and to estimate a valley shift direction accurately.

Figure 15:
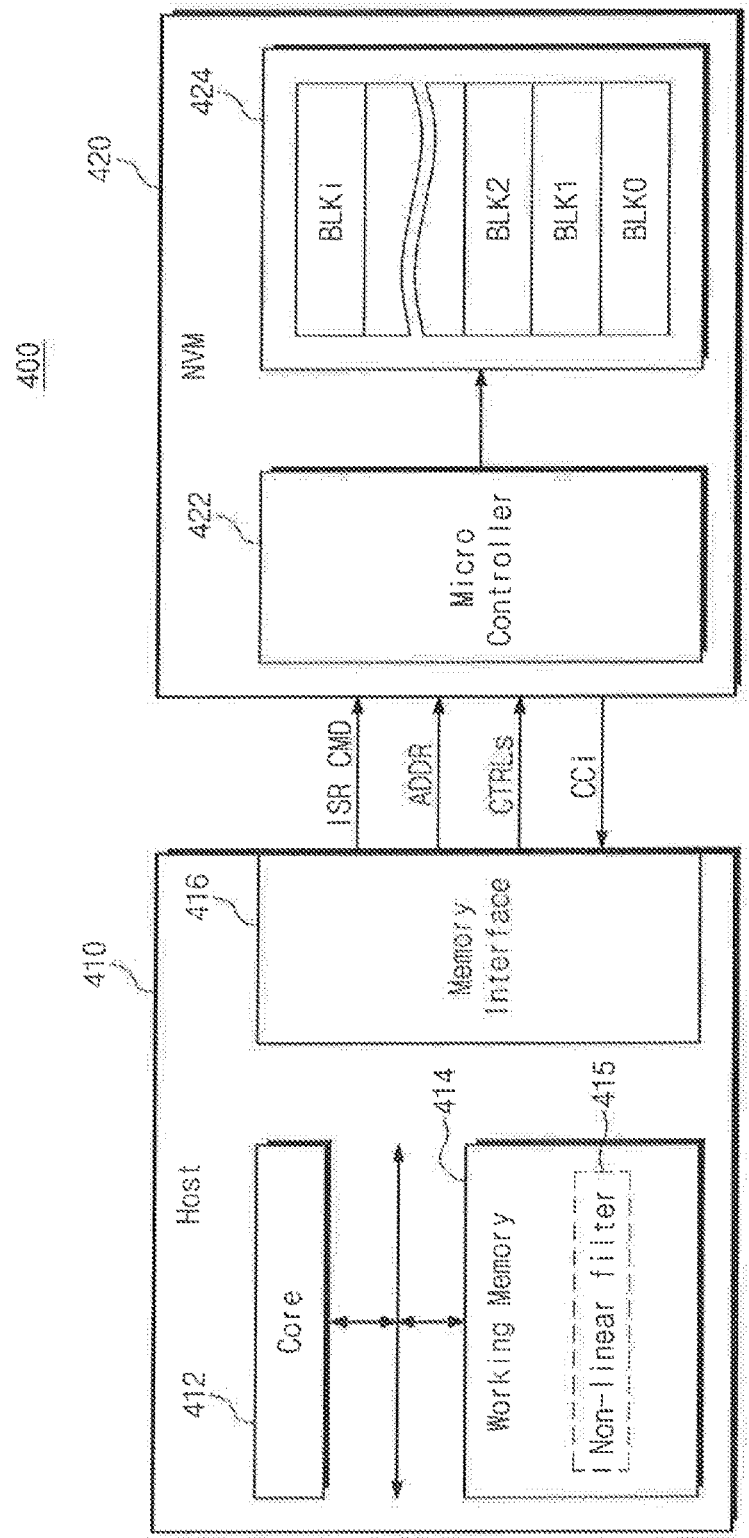
FIG. 15 is a block diagram illustrating a user system according to an embodiment of the disclosure.

FIG. 15 is a block diagram illustrating a user system according to another embodiment of the disclosure. Referring to FIG. 15, a user system 400 may include a host 410 and a storage device 420. The host 410 may include a core 412, a working memory 414, and a memory interface 416. The storage device 420 may include a micro-controller 422 and a nonvolatile memory device 424. Here, the storage device 420 may be implemented with a perfect page new (PPN) device.

The core 412 of the host 410 may execute various application programs loaded on the working memory 414 or may process data loaded on the working memory 414. Software such as an operating system and an application program may be loaded on the working memory 414. In particular, algorithm or software modules such as a non-linear filter 415 for processing a result of an iterative sampling read operation of the disclosure may be loaded on an operating system which is loaded on the working memory 414.

The memory interface 416 may convert a memory address access-requested by the core 412 into a physical address. The memory interface 416 may perform, for example, a function of a flash translation layer (FTL).

The storage device 420 may include the microcontroller 422 and the nonvolatile memory device 424. The microcontroller 422 may provide the nonvolatile memory device 424 with an iterative sampling read command ISR CMD, an addresses ADDR, control signals CTRLs, and data from the host 410. The storage device 420 may provide the host 410 with a cell count CCi for a requested voltage range in response to the iterative sampling read command ISR CMD.

Figure 16:
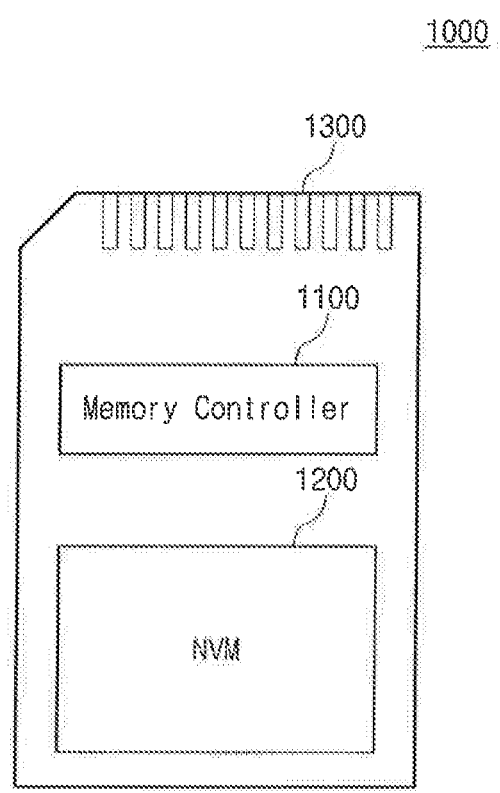
FIG. 16 is a block diagram illustrating a memory card system including a nonvolatile memory system according to an embodiment of the disclosure.

FIG. 16 is a block diagram illustrating a memory card system including a nonvolatile memory system according to an embodiment of the disclosure. Referring to FIG. 16, a memory card system 1000 may include a memory controller 1100, a nonvolatile memory 1200, and a connector 1300.

The memory controller 1100 may be connected to the nonvolatile memory 1200. The memory controller 1100 may be configured to access the nonvolatile memory 1200. For example, the memory controller 1200 may be configured to control an overall operation of the nonvolatile memory 1200 including, but not limited to, a read operation, a write operation, an erase operation, and a background operation. The background operation may include the following operations: wear-leveling management, garbage collection, and the like.

The memory controller 1100 may provide an interface between the nonvolatile memory 1200 and a host. The memory controller 11000 may be configured to drive firmware for controlling the nonvolatile memory 1200. In an embodiment, the memory controller 1100 may include components such as, but not limited to, a RAM, a processing unit, a host interface, a memory interface, and an error correction unit.

The memory controller 1100 may provide the iterative sampling read command ISR CMD of the disclosure to the nonvolatile memory 1200 in a situation such as a read fail. The memory controller 1100 may process a plurality of sampling values, which is provided in response to the iterative sampling read command ISR CMD, in a non-linear filtering manner, thereby minimizing an influence due to noise.

The memory controller 1100 may communicate with an external device through the connector 1300. The memory controller 1100 may communicate with an external device based on a specific communication protocol. For example, the memory controller 1100 may communicate with the external device through at least one of various communication protocols such as, but not limited to, universal serial bus (USB), multimedia card (MIMC), eMMC (embedded MMC), peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), Firewire, universal flash storage (UPS), and nonvolatile memory express (NVMe). In an embodiment, a write command defined by the above-described standards may include size information of write data.

The nonvolatile memory 1200 may be implemented with a variety of nonvolatile memory devices, such as, hut not limited to, an electrically erasable and programmable ROM (EEPROM), a NAND flash memory, a NOR flash memory, a phase-change RAM (PRAM), a resistive RAM (ReRAM), a ferroelectric RAM (PRAM), a spin-torque magnetic RAM (STT-MRAM), and the like.

In an embodiment, the memory controller 1100 and the nonvolatile memory 1200 may be integrated in a single semiconductor device. The memory controller 1100 and the nonvolatile memory 1200 may be integrated in a single semiconductor device to form a solid state drive (SSD). The memory controller 1100 and the nonvolatile memory 1200 may be integrated in a single semiconductor device to constitute a memory card. For example, the memory controller 1100 and the nonvolatile memory 1200 may be integrated in a single semiconductor device to compose a memory card such as, but not limited to, a PC card (a personal computer memory card international association (PCMCIA) card), a compact flash card (CP), a smart media card (SM, SMC), a memory stick, a multimedia card (MMC, RS-MMC, MMCmicro), an SD card (SD, miniSD, microSD, SDHC), and a universal flush storage (UPS).

Figure 17:
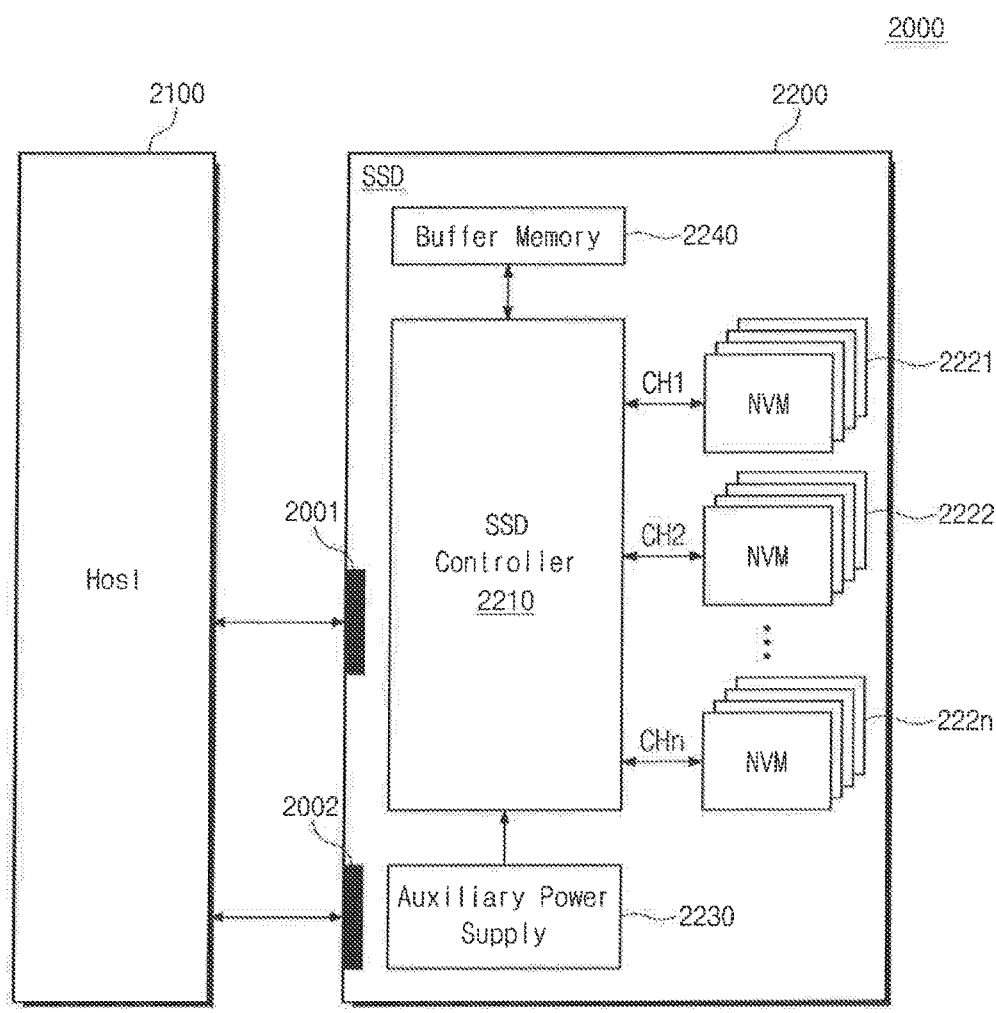
FIG. 17 is a block diagram illustrating a solid state drive including a nonvolatile memory system according to an embodiment of the disclosure.

FIG. 17 is a block diagram illustrating a solid state drive (SSD) including a nonvolatile memory system according to an embodiment of the disclosure. Referring to FIG. 17, a solid state drive (SSD) system 2000 may include a host 2100 and an SSD 2200. The SSD 2200 may exchange signals with the host 2100 through a signal connector 2001 and may be supplied with power through a power connector 2002. The SSD 2200 may include an SSD controller 2210, a plurality of flash memories 2221 to 222n, an auxiliary power supply 2230, and a buffer memory 2240.

The SSD controller 2210 may control the flash memories 2210 to 222n in response to the signal from the host 2100. The SSD controller 2210 may provide the iterative sampling read command ISR CMD to at least one of the flash memories 2221 to 222n in a situation such as a read fail. The memory controller 1100 may process a plurality of sampling values, which is provided in response to the iterative sampling read command ISR CMD, in a non-linear filtering manner, thereby minimizing an influence due to noise. There may be determined a read voltage lastly adjusted according to the above-described procedure.

The auxiliary power supply 2230 may be connected to the host 2100 via the power connector 2002. The auxiliary power supply 2230 may be charged by power from the host 2100. When power is not smoothly supplied from the host 2100, the auxiliary power supply 2230 may power the SSD system 2000. The auxiliary power supply 2230 may be placed inside or outside the SSD 2200. For example, the auxiliary power supply 2230 may be put on a main board to supply an auxiliary power to the SSD 2200.

The buffer memory 2240 may act as a buffer memory of the SSD 2200. For example, the buffer memory 2240 may temporarily store data received from the host 2100 or from the flash memories 2221 to 222n or may temporarily store metadata (e.g., mapping tables) of the flash memories 2221 to 322n. The buffer memory 2240 may include volatile memories such as a DRAM, an SDRAM, a DDR SDRAM, an LPDDR SDRAM, and an SRAM or nonvolatile memories such as a FRAM an ReRAM, an STT-MRAM, and a PRAM.

Figure 18:
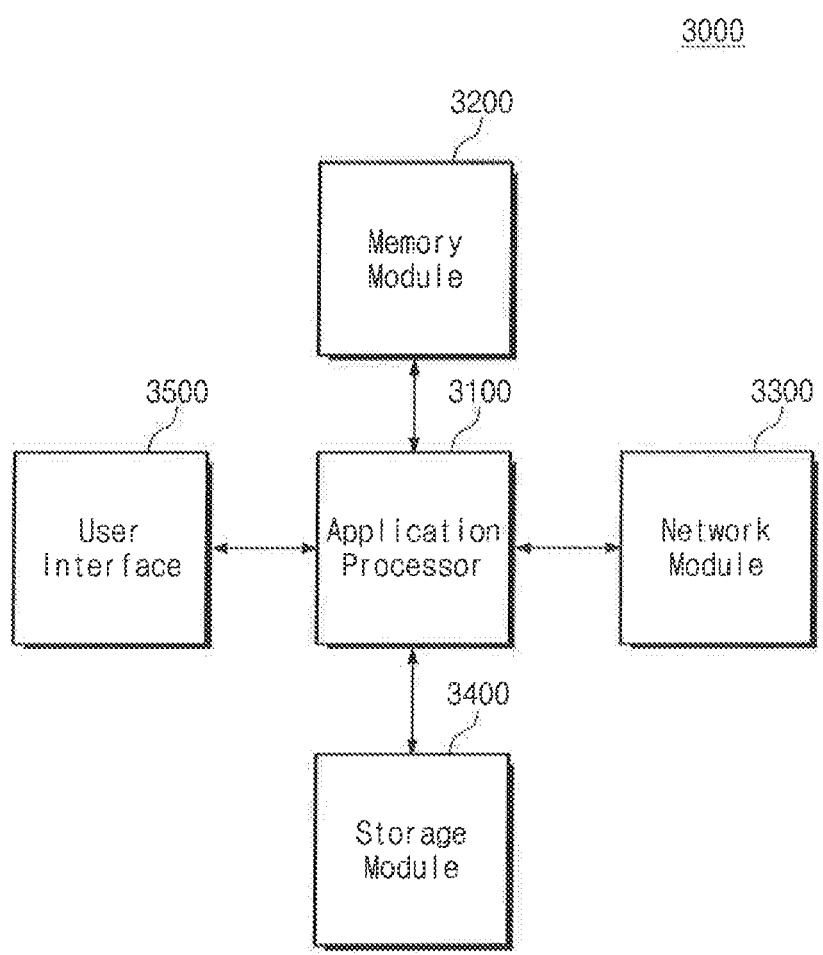
FIG. 18 is a block diagram illustrating a user system including a nonvolatile memory system according to another embodiment of the disclosure.

FIG. 18 is a block diagram illustrating a user system including a nonvolatile memory system according to another embodiment of the disclosure. Referring to FIG. 19, a user system 3000 may include an application processor 3100, a memory module 3200, a network module 3300, a storage module 3400, and a user interface 3500.

The application processor 3100 may drive component, an operating system, and the like of the user system 3000. For example, the application processor 3100 may include controllers for controlling components of the user system 3000, graphics engines, a variety of interfaces, and the like. For example, the application processor 3100 may be a system-on-chip (SoC).

The memory module 3200 may operate as a main memory, a working memory, a buffer memory, or a cache memory of the user system 3000. The memory module 3200 may be implemented with a volatile random access memory, such as DRAM, SDRAM, double date rate DRAM (DDR SDRAM), DDR2 SDRAM, DDR3 SDRAM, LPDDR DRAM, LPDDR2 DRAM, or LPDDR3 DRAM or a non-volatile random access memory, such as PRAM, MRAM, RRAM, or FRAM.

The network module 3300 may communicate with external devices. For example, the network module 3300 may support wireless communications, such as code division multiple access (CDMA), global system for mobile communication (GSM), wideband CDMA (WCDMA), CDMA-2000, time division multiple access (TDMA), long term evolution (LTE), Wimax, WLAN, UWB, Bluetooth, WI-DI, and the like. In an embodiment, the network module 3300 may be included in the application processor 3100.

The storage module 3400 may store data. For example, the storage module 3400 may store data received from the application processor 3100. Alternatively, the storage module 3400 may provide the application processor 3100 with data stored therein. The storage module 3400 may provide the iterative sampling read command ISR CMD to a storage medium in a situation such as a read fail. The storage module 3400 may process a plurality of sampling values, which is provided in response to the iterative sampling read command ISR CMD, in a non-linear filtering manner, thereby minimizing influence due to the noise. For example, the storage module 3400 may be implemented with a semiconductor memory device such as PRAM, MRAM, RRAM, NAND flash memory, NOR flash memory, or a three-dimensional NAND flash memory.

The user interface 3500 may include interfaces which input data or a command in the application processor 3100 or output data to an external device. For example, the user interface 3500 may include user input interfaces such as a keyboard, a keypad, buttons, a touch panel, a touch screen, a touch pad, a touch ball, a camera, a microphone, a gyroscope sensor, a vibration sensor, and the like. The user interface 3500 may further include user output interfaces such as a liquid crystal display (LCD), an organic light-emitting diode (OLED) display device, an active matrix OLED (AMOLED) display device, a light-emitting diode (LED), a speaker, and a motor.

As described above, exemplary embodiments are disclosed in the drawings and specifications. Here, the terminology used herein is for the purpose of describing particular embodiments only and is not intended to limit the disclosure. Therefore, it will be understood that various modifications and other equivalent embodiments are possible by those skilled in the art based upon the disclosure. The technical scope of the present disclosure will be defined by the technical spirit of the appended claims.

According to embodiments of the disclosure, it may be possible to effectively filter the noise included in a sampling value at a sampling read operation. Even though a sampling value of which the noise is relatively great is included, a sampling value may be accurately extracted. This may mean that a read voltage with high reliability is determined. Accordingly, the data integrity of the nonvolatile memory device may be markedly improved. In addition, the read performance of the nonvolatile memory device may be improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to embodiments, it will be apparent to those skilled in the art that various changes and modifications may be made without departing from the spirit and scope of the disclosure. Therefore, it should be understood that the above embodiments are not limiting, but illustrative.

What is claimed is:

1. A non-volatile memory system comprising:
    a nonvolatile memory device comprising a plurality of memory cells, where each memory cell comprises a plurality memory blocks and each memory block comprises a plurality of pages; and
    a memory controller configured to apply a read voltage at a first read level to read data from selected memory cells among the plurality of memory cells, transfer a command to the nonvolatile memory device to request a plurality of sampling values for a specific voltage range when the apply results in a read failure, receive the sampling values from the nonvolatile memory device in response to the command, apply non-linear filtering to the received sampling values to generate filtered values, and set the read voltage to a second read level based on the filtered values,
    wherein each of the filtered values indicates a number of the selected memory cells having a threshold voltage at the specific voltage range.

2. The non-volatile memory system of claim 1, where a given memory block among the plurality of memory blocks includes a plurality of cell strings arranged into rows and columns.

3. The non-volatile memory system of claim 2, wherein a first pair of the cell strings is connected to a first pair of string selection lines to constitute a first one of the rows, a second pair of the cell strings is connected to a second pair of string selection lines to constitute a second one of the rows, a cell string of the first pair and a cell string of the second pair are connected to a first bit line to constitute a first one of the columns, and the remaining cell string of the first pair and the remaining cell string of the second pair are connected to a second bit line to constitute a second one of the columns.

4. The non-volatile memory system of claim 1, wherein the nonvolatile memory device comprises a bit counter that is used to generate the sampling values.

5. The non-volatile memory system of claim 1, wherein the specific voltage range comprises a plurality of voltage sub-ranges, and the filtered values indicate a plurality of cell counts, where each cell count indicates a number of the selected memory cells having a threshold voltage at a corresponding one of the voltage sub-ranges.

6. The non-volatile memory system of claim 1, wherein the command includes a pair of sampling read voltages to be applied to the selected memory cells and a sampling frequency.

7. The non-volatile memory system of claim 6, wherein the nonvolatile memory device uses a first sampling read voltage among the pair to sense the selected memory cells to generated first sensed data, uses a second sampling read voltage among the pair to sense the selected memory cells to generated second sensed data, and performs an XOR operation on the first and second sensed data to generate some of the sampling values.

8. The non-volatile memory system of claim 1, wherein the command includes an address of the selected memory cells.

9. The non-volatile memory system of claim 6, wherein the nonvolatile memory device repeatedly performs a sampling operation on the selected memory cells using the pair of sampling read voltages at the sampling frequency to generate some of the sampling values.

10. The non-volatile memory system of claim 1, wherein the memory controller sets the second read level by:
selecting a minimum one of the filtered values; and
setting the second read level to a voltage associated with the selected one filtered value.

11. The non-volatile memory system of claim 1, wherein the memory controller sets the second read level by:
selecting a median value from among the filtered values in a threshold range; and
setting the second read level to a voltage associated with the selected median value.

12. The non-volatile memory system of claim 1, wherein the memory controller sets the second read level by:
averaging the filtered values to generate an average value; and
setting the second read level to a voltage associated with the average value.

13. The non-volatile memory system of claim 1, wherein the apply of the non-linear filtering comprises excluding some of the sampling values that do not fit a particular non-linear curve.

14. A method for controlling a non-volatile memory device comprising a plurality of memory cells and a memory controller, where each memory cell comprises a plurality of memory blocks and each memory block comprises a plurality of pages, the method comprising:
applying, by the memory controller, a read voltage at a first ead level to read data from selected memory cells among the plurality of memory cells;
transferring, by the memory controller, a command to the nonvolatile memory device to request a plurality of sampling values for a specific voltage range when the applying results in a read failure;
receiving, by the memory controller, sampling values from he nonvolatile memory device in response to the command;
applying, by the memory controller, non-linear filtering to the sampling values to generate filtered values; and
setting, by the memory controller, the read voltage to a second read level based on the filtered values,
wherein each of the filtered values indicates a number of the selected memory cells having a threshold voltage at the specific voltage range.

15. The method of claim 14, wherein the specific voltage range comprises a plurality of voltage sub-ranges, and the filtered values indicate a plurality of cell counts, where each cell count indicates a number of the selected memory cells having a threshold voltage at a corresponding one of the voltage sub-ranges.

16. The method of claim 14, wherein the command includes a pair of sampling read voltages to be applied to the selected memory cells and a sampling frequency.

17. The method of claim 16, further comprising the nonvolatile memory device repeatedly performing a sampling operation on the selected memory cells using the pair of sampling read voltages at the sampling frequency to generate some of the sampling values.

18. The method of claim 14, wherein the setting comprises:
selecting a minimum one of the filtered values; and
setting the second read level to a voltage associated with the selected one filtered value.

19. The method of claim 14, wherein the setting comprises:
selecting a median value from among the filtered values in a threshold range; and
setting the second read level to a voltage associated with the selected median value.

20. The method of claim 14, wherein the setting comprises:
averaging the filtered values to generate an average value; and
setting the second read level to a voltage associated with the average value.

21. The method of claim 14, wherein the applying of the non-linear filtering comprises excluding some of the sampling values that do not fit a particular non-linear curve.

22. A non-volatile memory system comprising:
a nonvolatile memory device comprising a plurality of memory cells, where each memory cell comprises a plurality memory blocks and each memory block comprises a plurality of pages; and
a memory controller configured to apply a read voltage at a first read level to read data from selected memory cells among the plurality of memory cells, transfer a command to the nonvolatile memory device to request a plurality of sampling values for a specific voltage range when the apply results in a read failure, receive the sampling values from the nonvolatile memory device in response to the command, discard the sampling values having corresponding voltages outside a threshold range of a threshold voltage distribution of the selected memory cells, and set the read voltage to a second read level based on the remaining sampling values,
wherein each of the remaining sampling values indicates a number of the selected memory cells having a threshold voltage at the specific voltage range.

23. The non-volatile memory system of claim 22, wherein the threshold voltage distribution is a first curve, and the threshold range is defined by a second curve and a third curve of a cell count, where the second curve is lower than the first curve and the third curve is higher than the first curve.

24. The non-volatile memory system of claim 22, where a given memory block among the plurality of memory blocks includes a plurality of cell strings arranged into rows and columns.

25. The memory system of claim 24, wherein a first pair of the cell strings is connected to a first pair of string selection lines to constitute a first one of the rows, a second pair of the cell strings is connected to a second pair of string selection lines to constitute a second one of the rows, a cell string of the first pair and a cell string of the second pair are connected to a first bit line to constitute a first one of the columns, and the remaining cell string of the first pair and the remaining cell string of the second pair are connected to a second bit line to constitute a second one of the columns.

26. The non-volatile memory system of claim 22, wherein the nonvolatile memory device comprises a bit counter that is used to generate the sampling values.

27. The non-volatile memory system of claim 22, wherein the specific voltage range comprises a plurality of voltage sub-ranges, and the filtered values indicate a plurality of cell counts, where each cell count indicates a number of the selected memory cells having a threshold voltage at a corresponding one of the voltage sub-ranges.

28. The non-volatile memory system of claim 22, wherein the command includes a pair of sampling read voltages to be applied to the selected memory cells and a sampling frequency.

29. The non-volatile memory system of claim 22, wherein the command includes an address of the selected memory cells.

30. The non-volatile memory system of claim 28, wherein the nonvolatile memory device repeatedly performs a sampling operation on the selected memory cells using the pair of sampling read voltages at the sampling frequency to generate some of the sampling values.

31. A method for controlling a non-volatile memory device comprising a plurality of memory cells and a memory controller, where each memory cell comprises a plurality of memory blocks and each memory block comprises a plurality of pages, the method comprising:
applying, by the memory controller, a read voltage at a first read level to read data from selected memory cells among the plurality of memory cells;
transferring, by the memory controller, a command to the nonvolatile memory device to request a plurality of sampling values for a specific voltage range when the applying results in a read failure;
receiving, by the memory controller, sampling values from the nonvolatile memory device in response to the command;
discarding, by the memory controller, the sampling values having corresponding voltages outside a threshold range of a threshold voltage distribution of the selected memory cells; and
setting, by the memory controller, the read voltage to a second read level based on the remaining sampling values,
wherein each of the remaining values indicates a number of the selected memory cells having a threshold voltage at the specific voltage range.

32. The method of claim 31, wherein the specific voltage range comprises a plurality of voltage sub-ranges, and the filtered values indicate a plurality of cell counts, where each cell count indicates a number of the selected memory cells having a threshold voltage at a corresponding one of the voltage sub-ranges.

33. The method of claim 31, wherein the command includes a pair of sampling read voltages to be applied to the selected memory cells and a sampling frequency.

34. The method of claim 33, further comprising the nonvolatile memory device repeatedly performing a sampling operation on the selected memory cells using the pair of sampling read voltages at the sampling frequency to generate some of the sampling values.

35. The method of claim 31, wherein the command includes an address of the selected memory cells.

* * * * *